(12) United States Patent
Parpia et al.

(10) Patent No.: US 8,174,352 B2
(45) Date of Patent: May 8, 2012

(54) METHOD FOR MAKING A TRANSDUCER, TRANSDUCER MADE THEREFROM, AND APPLICATIONS THEREOF

(75) Inventors: Jeevak M. Parpia, Ithaca, NY (US); Harold G. Craighead, Ithaca, NY (US); Joshua D. Cross, Ithaca, NY (US); Bojan Robert Ilic, Ithaca, NY (US); Maxim K. Zalalutdinov, Silver Spring, MD (US); Jeffrey W. Baldwin, Alexandria, VA (US); Brian H. Houston, Fairfax, VA (US)

(73) Assignees: Cornell University, Ithaca, NY (US); The United States of America as Represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 13/000,644

(22) PCT Filed: Jun. 26, 2009

(86) PCT No.: PCT/US2009/048750
§ 371 (c)(1),
(2), (4) Date: Dec. 22, 2010

(87) PCT Pub. No.: WO2010/096077
PCT Pub. Date: Aug. 26, 2010

(65) Prior Publication Data
US 2011/0121937 A1 May 26, 2011

Related U.S. Application Data

(60) Provisional application No. 61/075,773, filed on Jun. 26, 2008, provisional application No. 61/075,855, filed on Jun. 26, 2008.

(51) Int. Cl.
*G01L 1/22* (2006.01)

(52) U.S. Cl. .......... 338/2; 73/204.26; 438/200; 257/254
(58) Field of Classification Search .............. 338/22 SD, 338/2, 13; 438/200; 310/358; 257/254, 257/418; 73/204.26, 863.352, 861.355
See application file for complete search history.

(56) References Cited

U.S. PATENT DOCUMENTS
7,196,457 B2 * 3/2007 Miyazawa et al. ............ 310/358
(Continued)

FOREIGN PATENT DOCUMENTS
EP 0862995 A2 9/1998

*Primary Examiner* — Kyung Lee
(74) *Attorney, Agent, or Firm* — William Greener; Bond, Schoeneck & King, PLLC

(57) ABSTRACT

A method for manufacturing or preparing thin-film stacks that exhibit moderate, finite, stress-dependent resistance and which can be incorporated into a transduction mechanism that enables simple, effective signal to be read out from a micro- or nano-mechanical structure. As the structure is driven, the resistance of the intermediate layers is modulated in tandem with the motion, and with suitable dc-bias, the motion is directly converted into detectable voltage. In general, detecting signal from MEMS or NEMS devices is difficult, especially using a method that is able to be integrated with standard electronics. The thin-film manufacturing or preparation technique described herein is therefore a technical advance in the field of MEMS/NEMS that could enable new applications as well as the ability to easily develop CMOS-MEMS integrated fabrication techniques. Also disclosed are: (i) transducers where current flows across a piezo layer from one major surface to the opposite major surface; and (ii) methods of making a transducer the resistivity of a piezoresistive layer is decreased and/or the gauge factor of a piezoresistive layer is increased.

37 Claims, 23 Drawing Sheets

U.S. PATENT DOCUMENTS

| | | | |
|---|---|---|---|
| 7,228,735 B2 * | 6/2007 | Sparks et al. | 73/204.26 |
| 2003/0117257 A1 * | 6/2003 | Cunningham | 338/200 |
| 2004/0109250 A1 | 6/2004 | Choi | |
| 2005/0146249 A1 * | 7/2005 | Miyazawa et al. | 310/358 |
| 2006/0038643 A1 * | 2/2006 | Xu et al. | 335/78 |
| 2006/0157808 A1 * | 7/2006 | Matsuo | 257/415 |
| 2006/0267178 A1 | 11/2006 | Metzger | |
| 2007/0278600 A1 * | 12/2007 | Zhan et al. | 257/415 |
| 2008/0202239 A1 * | 8/2008 | Fazzio et al. | 73/504.18 |

* cited by examiner

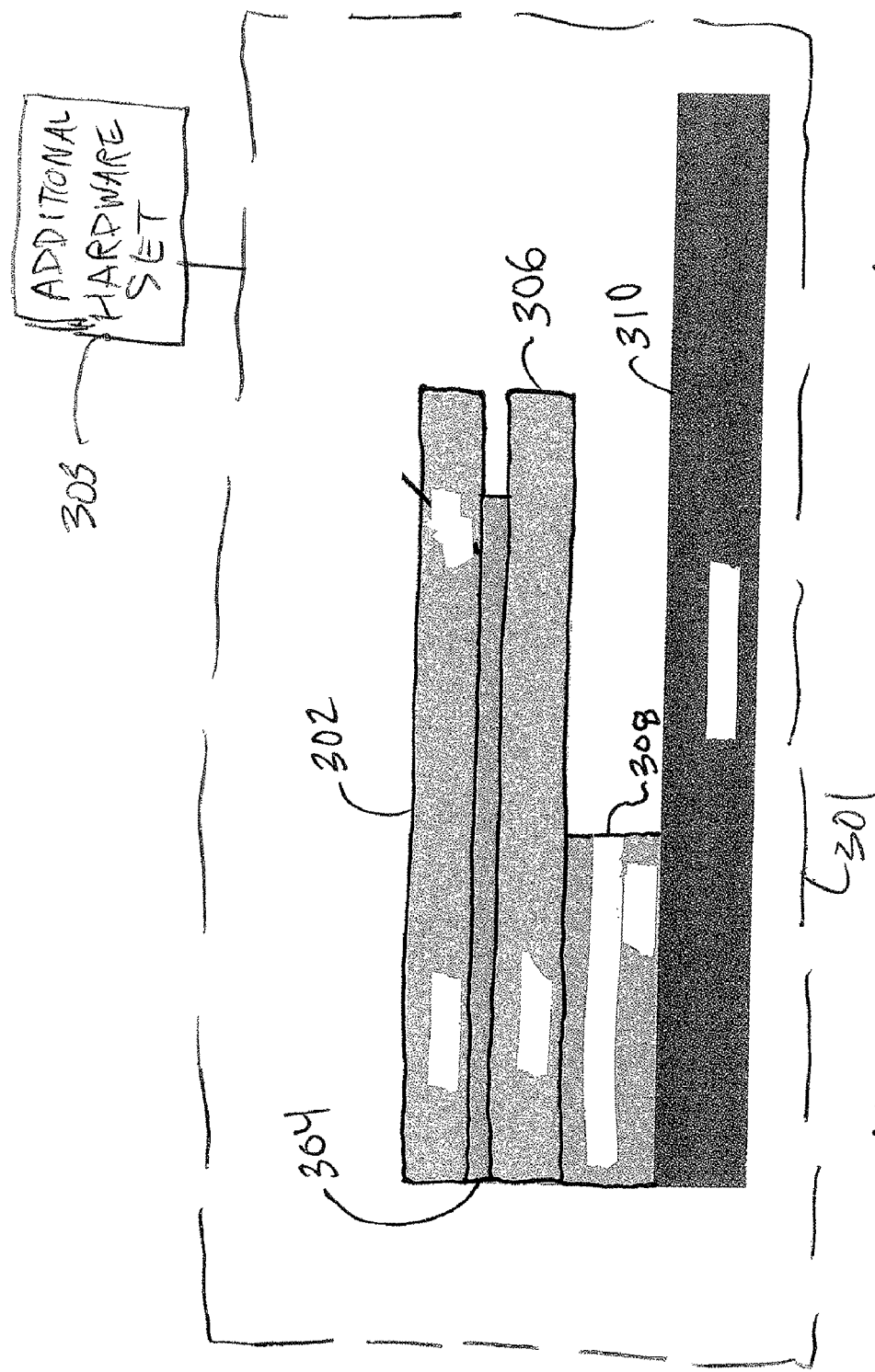

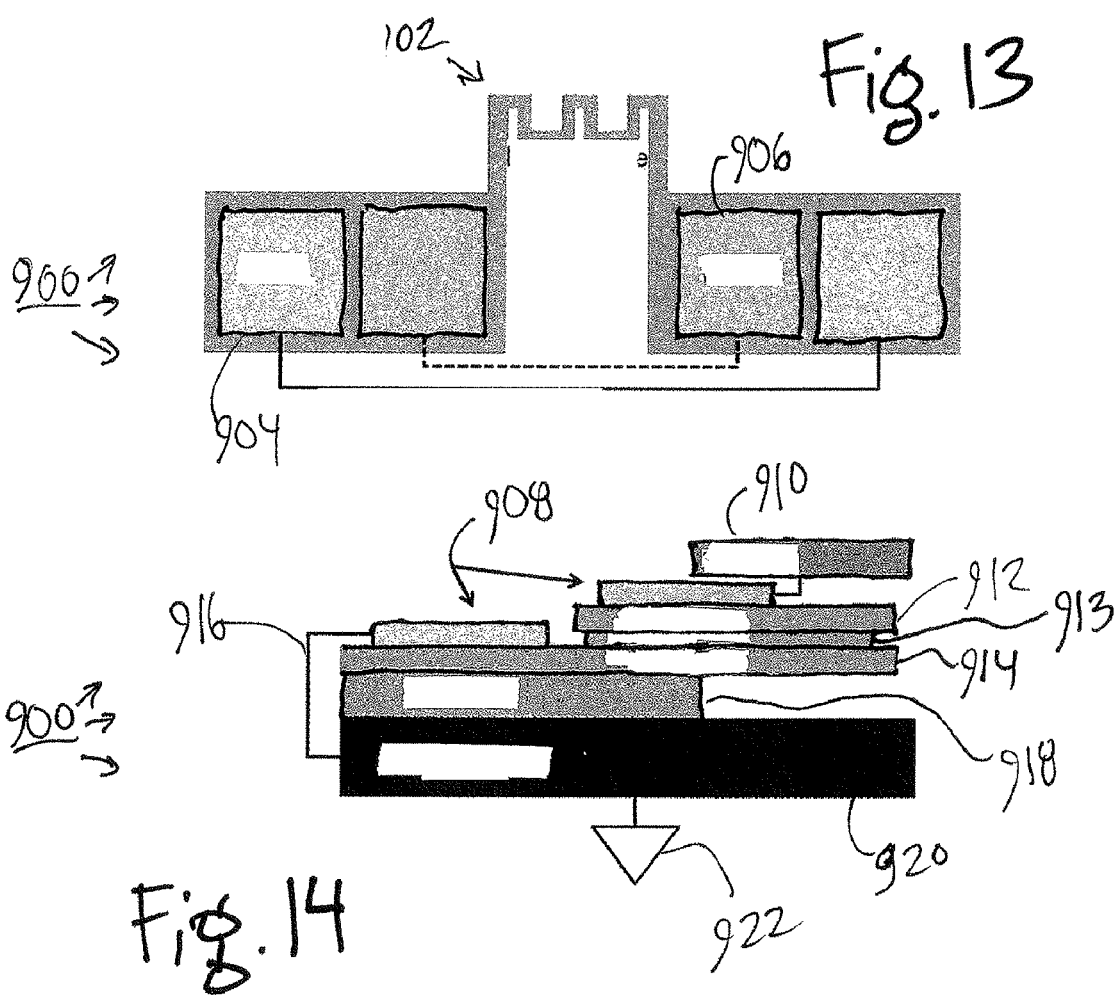

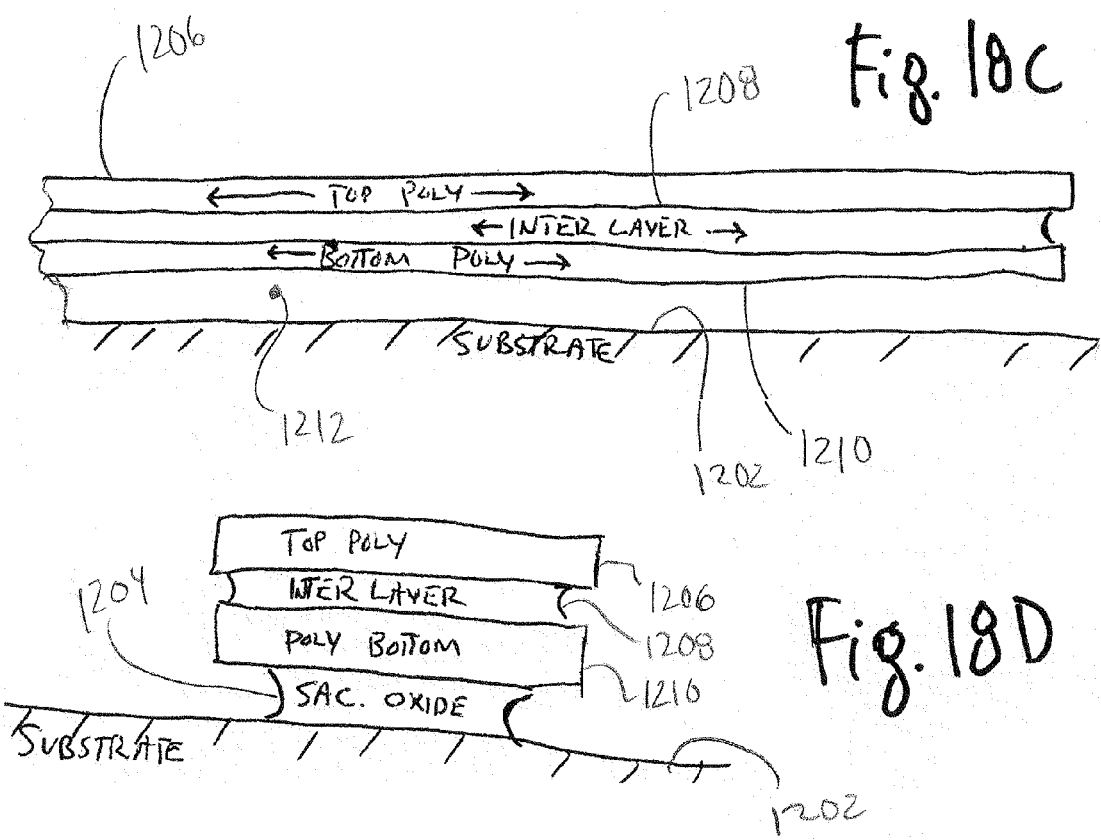

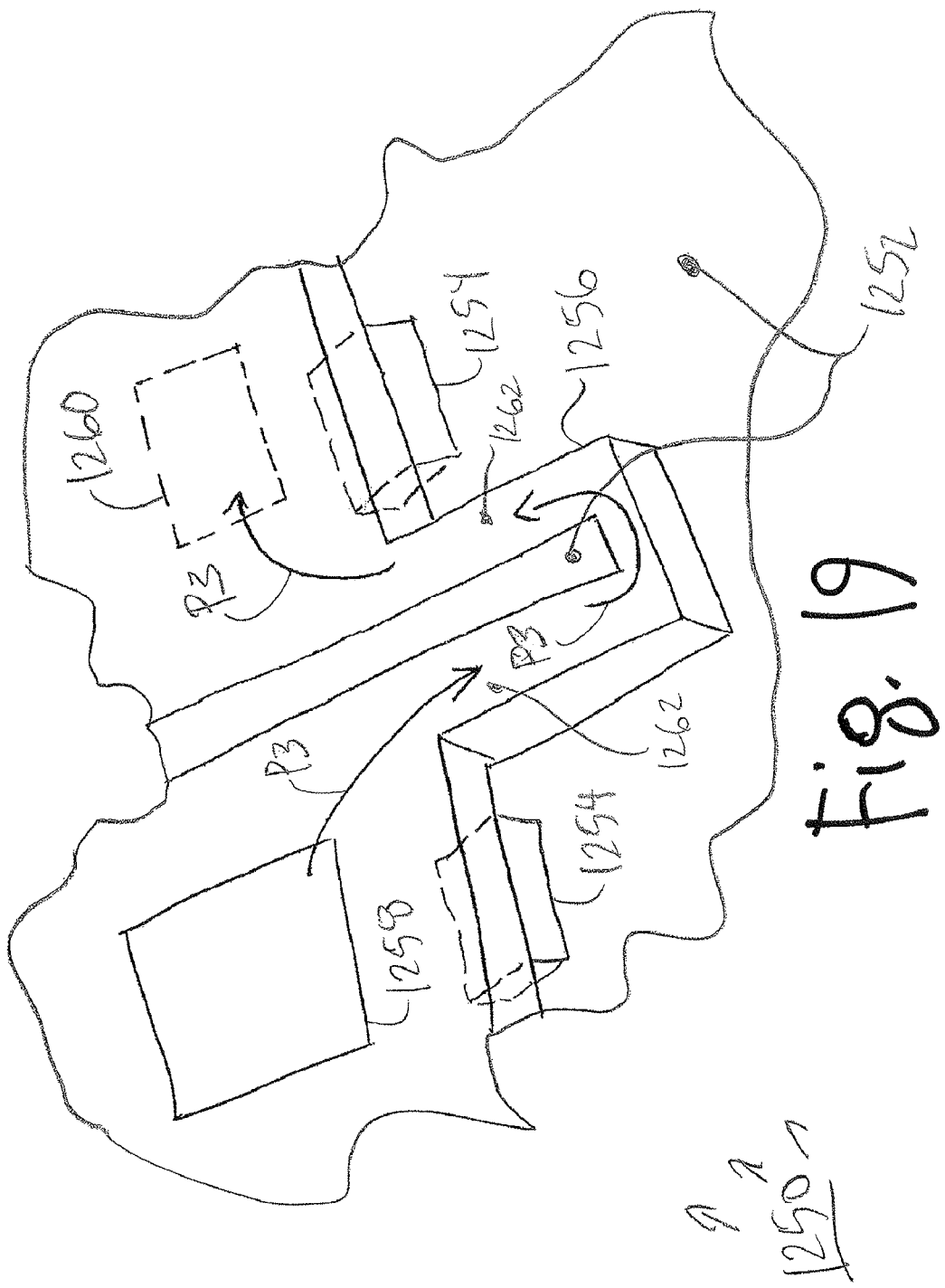

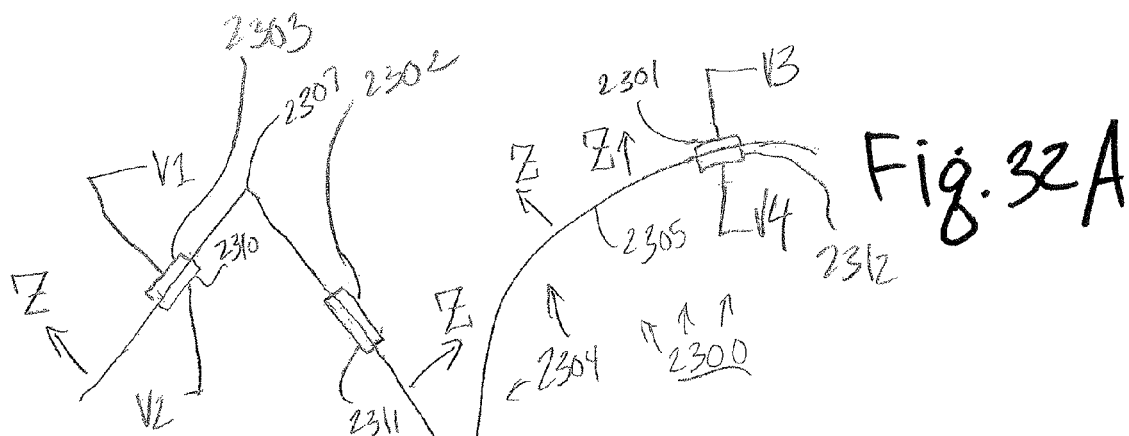
Fig. 32A
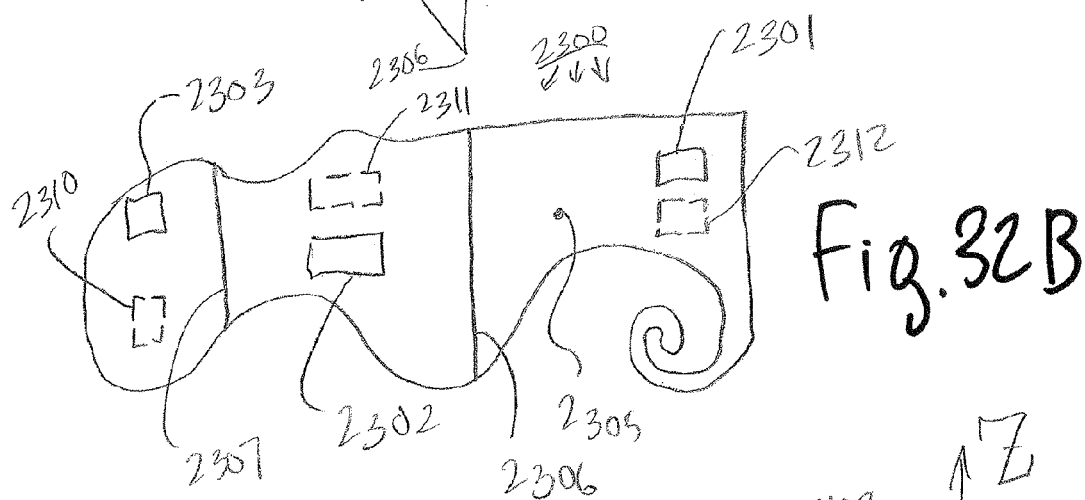
Fig. 32B
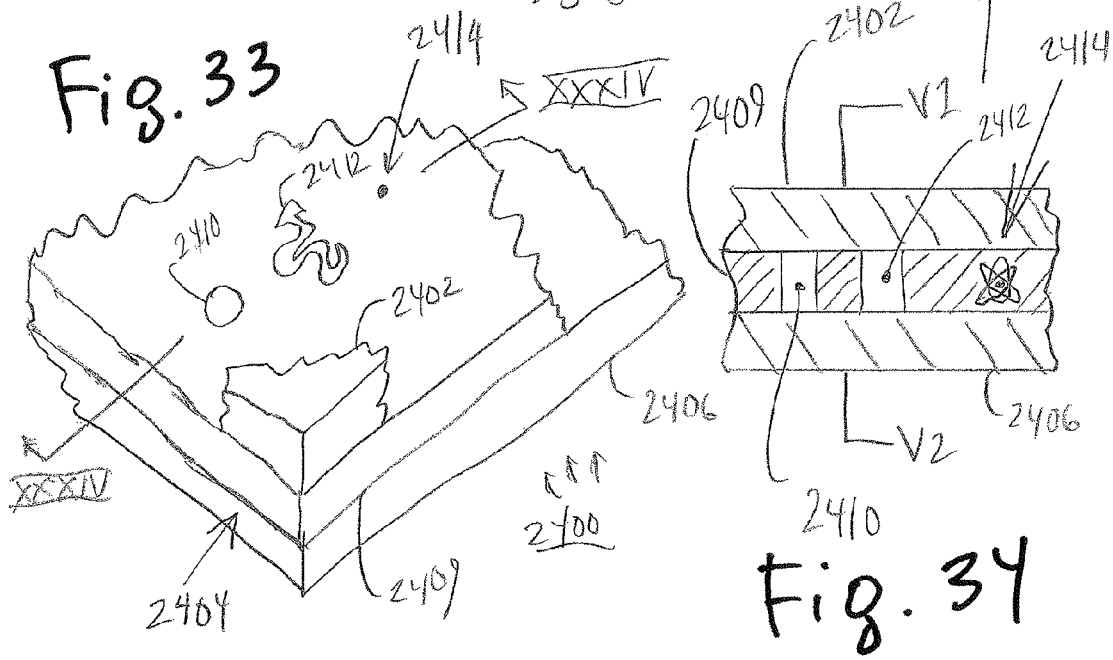
Fig. 33
Fig. 34

METHOD FOR MAKING A TRANSDUCER, TRANSDUCER MADE THEREFROM, AND APPLICATIONS THEREOF

CROSS-REFERENCE TO RELATED APPLICATIONS

This is application claims the benefit of priority under 35 U.S.C. §119(e) to: (i) U.S. Provisional Patent Application Ser. No. 61/075,773 filed on Jun. 26, 2008; and (ii) U.S. Provisional Patent Application Ser. No. 61/075,855 filed on Jun. 26, 2008; the subject matter of all of the foregoing documents are incorporated herein by reference in their respective entireties.

GOVERNMENT SPONSORSHIP

This invention was made with government support under: (i) Contract No. N0001408WX30004 awarded by the Office of Naval Research (ONR); and (ii) Grant number: HR0011-06-1-0042 awarded by the Department of Defense, specifically DAPRA. The government has certain rights in the invention.

BACKGROUND OF THE INVENTION

1. Field of the Invention

Embodiments of the invention are generally directed to transducer type devices (see DEFINITIONS section) having a laminate structure including a layer with piezo properties (see DEFINITIONS section) and methods for making a transducer. More particularly, embodiments of the invention are directed to methods and/or devices relating to MEMS-scale or NEMS-scale transducers having a laminate structure including a layer with piezoresistive properties.

2. Background

Applications such as radio frequency (RF) signal processing and reference frequency oscillators, benefit from high quality factor, high frequency devices that have very small footprints, consume minimal power, and can be monolithically integrated with conventional microprocessor integrated circuit (IC) fabrication processes. Micro- or nano-mechanical resonators offer the possibility of achieving these goals.

An ongoing challenge surrounding micro- or nano-mechanical resonator structures and their utility in applications is measuring the motion of the resonators in a way that is readily incorporated into a real-world device. Methods currently used in the laboratory include optical and magnetomotive. Neither of these techniques is straightforward to implement in a device using standard fabrication techniques and requiring low cost and low power consumption. Electrical transduction methods exist but are less effective as device size is reduced to the micron and nanometer scale.

Some conventional transducer type devices use a layer with piezo resistive properties to actuate and or detect motion at the nano or microscale. As shown in FIG. 1, an example of such a conventional device 100 includes: first electrical contact (or simply first contact) 102; piezoresistive layer(s) 104; and second contact 106. In device 100, electricity is conducted through piezoresistive layer 104, along current path P1 along the major surface of the piezo layer, between contacts 102, 106. The characteristics of the electrical signal passing through P1 will change with the amount of stress or strain in piezoresistive layer 104, which means that the electrical characteristics of this signal will change as layer 104 moves. This relationship between the electrical signals and motion in layer 104 is what makes device 100 useful as a small scale (see DEFINITIONS section) transducer and/or actuator. It is noted that because electrical contacts 102, 106 are both on the same major surface of layer 104, the direction of signal P1 is in-plane (see DEFINITIONS section).

FIGS. 2 and 3 show device 200 including first contact 202, piezoresistive layer 204 and second contact 206. In device 200, the current path P2 is once again in-plane because both contacts 202 and 206 are on the same major surface of layer 204.

Other publications which may be of interest include: (i) US published patent application 2008/0068000 ("Bargatin"); (ii) U.S. Pat. No. 7,5q7,711 ("Naniwanda"); (iii) European patent Application EP 1 538 747 A1 ("Kihara"); (iv) US published patent application 2006/0098059 ("Ohguro"); (v) D. W. Carr, L. Sekaric, H. G. Craighead, J. Vac. Sci. Technol. B16, 3821 (1998); (vi) I. Bargatin, E. B. Myers, J. Arlett, B. Gudlewski, M. L. Roukes, Appl. Phys. Lett. 86, 133109 (2005); (vii) "RF MEMS Oscillator with Integrated Resistive Transduction" by R. B. Reichenbach, M. Zalalutdinov, J. M. Parpia, H. G. Craighead, IEEE Elec. Dev. Lett. 27, 805 (October 2006); (viii) P. A. Truitt, J. B. Hertzberg, C. C. Huang, K. L. Ekinci, K. C. Schwab, Nano Lett. 7, 120 (2007); (ix) R. J. Wilfinger, P. H. Bardell, D. S. Chhabra, IBM Journal, pp. 113-118 (1968); (x) N. Barniol, M. Villarroya, J. Verd, J. Teva, G. Abadal, E. Forsen, F. P. Murano, A. Uranga, E. Figueras, J. Montserrat, J. Esteve, A. Boisen, Sens. and Act. A 132, 154 (2006); (xi) S. Evoy, D. W. Can, L. Sekaric, A. Olkhovets, J. M. Parpia, H. G. Craighead, J. Appl. Phys. 86, 6072 (1999); (xii) L. Sekaric, M. Zalalutdinov, S. W. Turner, A. T. Zehnder, J. M. Parpia, H. G. Craighead, Appl. Phys. Lett. 80, 3617 (2002); (xiii) Y. Xie, S.-S. Li, Y.-W. Lin, Z. Ren, C. T.-C. Nguyen, IEEE Trans. on Ultra., Ferro., and Freq. Cont. 55, 890 (2008); (xiv) "Ultra-Sensitive NEMS-based cantilevers for sensing, scanned probe and very high-frequency applications" by M. Li, H. X. Tang, M. L. Roukes, Nat. Nanotech. 2, 114 (28 Jan. 2007); (xv) V. Mosser, J. Suski, J. Goss, E. Obermeier, Sens. and Act. A 28, 113 (1991); (xvi) R. L. Parker, A. Krinsky, J. Appl. Phys. 34, 2700 (1963); (xvii) J. A. Harley, T. W. Kenny, Appl. Phys. Lett. 72, 289 (1999); (xviii) M. T. Kim, Thin Solid Films 283, 12-16 (1996); (xix) H. W. Ch. Postma, I. Kozinsky, A. Husain, M. L. Roukes, Appl. Phys. Lett. 86, 223105 (2005); (xx) A. H. Neyfeh, D. T. Mook, Nonlinear Oscillations, pp. 161-175 (John Wiley & Sons, New York, 1979); (xxi) W. Weaver Jr., S. P. Timoshenko, D. H. Young, Vibration Problems in Engineering, 5th ed., pp. 166-175 (John Wiley & Sons, New York, 1990); (xxii) R. He, X. L. Feng, M. L Roukes, P. Yang, Nano Lett. 8, 1756 (2008); and (xxiii) J. L. Artlett, J. R. Maloney, B. Gudlewski, M. Muluneh, M. L Roukes, Nano Lett. 6, 1000 (2006).

Description of the Related Art Section Disclaimer

To the extent that specific publications are discussed above in this Description of the Related Art Section, these discussions should not be taken as an admission that the discussed publications (for example, published patents) are prior art for patent law purposes. For example, some or all of the discussed publications may not be sufficiently early in time, may not reflect subject matter developed early enough in time and/or may not be sufficiently enabling so as to amount to prior art for patent law purposes. To the extent that specific publications are discussed above in this Description of the Related Art Section, they are all hereby incorporated by reference into this document in their respective entirety(ies).

SUMMARY

An embodiment of the present invention is directed to transducer type devices that include at least one piezo layer(s)

with piezo properties (see DEFINITIONS section), having a current path that travels through the (at least one) piezo layer from an electrical contact on one of its major surfaces, transversely across the piezo layer to another electrical contact on its opposite major surface. This is sometimes referred to herein as current path in a cross-plane direction (see DEFINITIONS section). Depending upon the relative positions of electrical contacts on the opposite, respective major surfaces of the piezo layer, the cross plane current path(s) between these contacts may also have an in-plane directional component of travel, but the current path(s) would still be considered to be cross-plane because current travels primarily into one major surface and out the opposite surface of the piezo layer. The opposing contacts may be in the form of conductive layers structured as thin films, such as highly doped polysilicon. These conductive layers may be in a thin film stack with the piezo layer(s). Because of the piezo properties of the piezo layer(s): (i) motion induced within in the piezo layer(s) will affect the electrical signal passing through the cross-plane current path so that the induced motion can be effectively detected using information derived from the cross-plane electrical signal; and/or (ii) the cross-plane electrical signal can be used to induce motion within the piezo layer(s). The device may be sized to be small scale (see DEFINITIONS section), so that various micro and/or nano scale devices such as transducers, resonators and/or actuators can be made using methods described herein.

The piezo layer(s) may be piezoresistive or piezoconductive. For example, when motion, such as vibrational motion or resonant vibrational motion, is induced in a piezoresistive layer, such as a silicon dioxide layer, mechanical stresses and/or strains will change in the piezoresistive layer to thereby cause changes in electrical resistance through the piezoresistive layer. These changes in resistance can be determined by detection of the electrical characteristics (for example, electrical current) of an electrical signal passing through the cross-plane current path in the piezoresistive layer. In a transducer device structured so that the piezoresistive layer(s) and the conductive layers adjacent to it are at least somewhat free to vibrate: (i) the vibration causes cyclical stresses and/or strains in the vicinity of the cross-plane current path; and (ii) the cyclical stresses and/or strains cause electrically detectable, cyclical changes in resistance in the cross-plane current path that runs between the conductive layers through the piezoresistive layer(s).

According to an aspect of the present invention, a transducer includes a substrate and a transducer assembly. The transducer assembly includes a first contact member, a second contact member, and a moveable piezo layer. The transducer assembly is mechanically connected to the substrate. The first electrical contact is electrically connected to a first major surface of the piezo layer. The second electrical contact is electrically connected to a second major surface of the piezo layer, with the second major surface being opposite the first major surface.

According to a further aspect, a transducer includes a substrate, an isolation layer and a transducer assembly. The transducer assembly is in the form of a thin-film stack including a first electrically conductive layer, a stress dependent layer and a second electrically conductive layer, with the isolation layer mechanically connecting the thin film stack to the substrate so that at least a portion of the thin-film stack is free to move out-of-plane. The stress dependent layer is disposed at least partially between the first electrically conductive layer and the second electrically conductive layer. The transducer assembly has an at least one electrical conduction path from the first electrically conductive layer to the second electrically conductive layer extending through the stress dependent layer. Because the stress dependent layer is located between conductive layers, there will be cross-plane, or transverse, current flow in transducers made according to this aspect. It is further noted that there may be other, additional intermediate layers (stress dependent or not) located between the first electrically conductive layer and the second electrically conductive layer.

According to an embodiment of the invention, a method for making a transducer includes the following steps (not necessarily in the following order): (a) providing a substrate; (b) providing at least a portion of an isolation layer over at least a portion of the substrate; (c) providing at least a portion of a first electrically conductive layer over at least a portion of the isolation layer; (d) providing at least a portion of a piezoresistive layer over at least a portion of the first electrically conductive layer; (e) providing at least a portion of a second electrically conductive layer over at least a portion of the piezoresistive layer; and (f) acting on the transducer to do at least one of following: (i) reduce the resistance of the piezoresistive layer, and (ii) increase a piezoresistive response of the piezoresistive layer.

According to a aspect of the present invention, a method of making a transducer includes the following steps (not necessarily in the following order except as explicitly indicated): (a) providing a substrate; (b) providing at least a portion of an isolation layer over at least a portion of the substrate; (c) providing at least a portion of a first electrically conductive layer over at least a portion of the isolation layer; (d) providing at least a portion of a piezoresistive layer over at least a portion of the first electrically conductive layer, with the piezoresistive layer having a gauge factor of less than 0.1; (e) providing at least a portion of a second electrically conductive layer over at least a portion of the piezoresistive layer; and (f) increasing the gauge factor of the piezoresistive layer to a value greater than 0.1.

According to an aspect of the present invention, treatment methods are utilized to lower the resistance in a stress dependent layer (see DEFINITIONS section) of the device. In an aspect, transducer type devices are treated, with an in-situ "treatment"—that is, a process that can be applied when the transducer type device is already otherwise completely fabricated, and that process enables or enhances the transduction ability. Two exemplary treatment methods are: (i) application of a breakdown voltage through the stress dependent layer; and/or (ii) buffered oxide etch.

BRIEF DESCRIPTION OF THE DRAWINGS

The present invention will be more fully understood and appreciated by reading the following Detailed Description in conjunction with the accompanying drawings, in which:

FIG. 4 is a cross-sectional view (cross hatching omitted for clarity) of a first embodiment of a device according to the present invention;

FIG. 13 is, a schematic view of a fifth embodiment of a device according to the present invention;

FIG. 14 is a cross-sectional view (cross hatching omitted for clarity) of the fifth embodiment device;

FIG. 18C is a cross-section of FIG. 18A;

FIG. 18D is a cross-section of FIG. 18A;

FIG. 19 is a perspective view of a ninth embodiment of a device according to the present invention;

FIGS. 32A and B show orthographic side and top views of a seventeenth embodiment of a device according to the present invention;

FIG. 33 shows a perspective view of an eighteenth embodiment of a device according to the present invention;

FIG. 34 shows a cross-sectional view of the eighteenth embodiment device;

DETAILED DESCRIPTION OF EMBODIMENTS OF THE INVENTION

Figure 1:
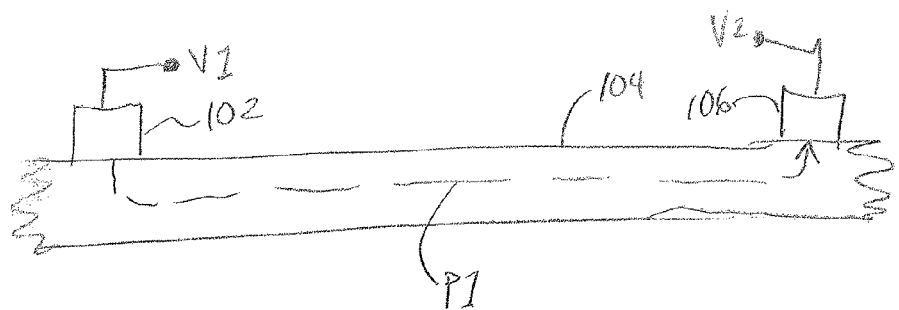
FIG. 1 is a cross-sectional view (cross hatching omitted for clarity) of a prior art device.
Figure 3:
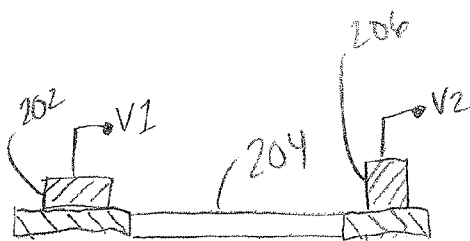
FIG. 3 is a cross-sectional view of the FIG. 2 device.
Figure 2:
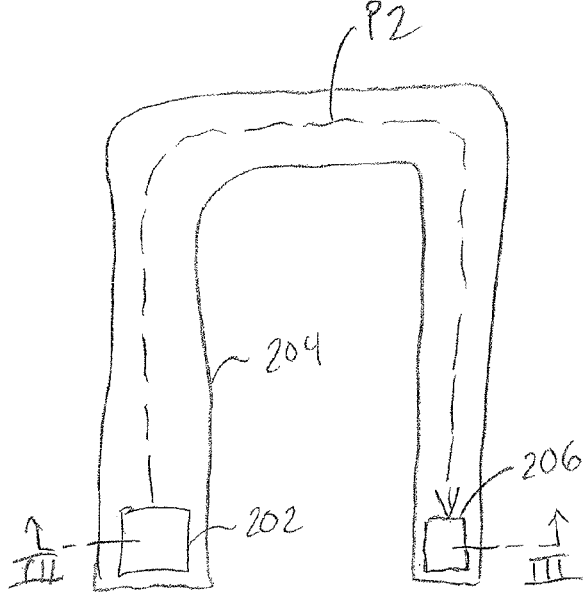
FIG. 2 is an orthographic top view of another prior art device.

Part One: General Discussion with Minimal Reference to the Figures

Certain embodiments (see DEFINITIONS section) of the invention described herein pertain to various methods for manufacturing or treating a thin-film stack such that it exhibits stress-dependent resistance or conductivity. For example, some of these methods of manufacturing and/or treating thin-films can be used to produce a transduction mechanism that is easy to implement and effective at producing electrical signals corresponding to motion in micro- and/or nano-mechanical devices.

Some embodiments of the present invention are micromechanical and nanomechanical resonating structures using a thin-film stack (see FIG. 4). In some embodiments, the thin-film stack mimics the film stack found in nearly all electronics foundry processes (see FIG. 5). While some embodiments mimic a conventional foundry process, other methods according to at least some aspects of the present invention may be implemented in film stacks possessing at least two conductive layers separated by at least one layer with a stress-dependent resistance. For example, the present inventors have manufactured a prototype device at the Cornell NanoScale Science & Technology Facility (CNF) using highly doped polysilicon and thermally grown silicon dioxide. These devices exhibit a transduction mechanism as described below. One embodiment of an exemplary film stack is shown in FIG. 6.

A procedure for manufacturing thin-film micro- or nano-mechanical structures, which can be used to make devices according to at least some aspects of the present invention, includes the following steps: (i) a substrate (silicon in this non-limiting, example) forms the basis for the film stack; (ii) a sacrificial film is grown or deposited upon the substrate (one possible sacrificial film is thermally grown silicon dioxide, approximately 750 nm thick, though other sacrificial materials are possible); (iii) the bottom conductive layer of the thin-film is grown upon the sacrificial material (one possible material for the bottom conductive layer is highly doped polysilicon (about 300 nm); (iv) the intermediate film stack, having piezo properties, is established through growth or deposition (one possible material for the intermediate film stack is a single layer of thermally grown silicon dioxide (about 50 nm)); (v) once the intermediate layer(s) are established, the top conductive layer is grown or deposited (one possible material for the top electrode layer is highly doped polysilicon as the top layer (about 300 nm)). Electrodes are lithographically patterned and evaporated onto both the top and bottom conductive layers (polysilicon layers). These electrodes were used to "treat," or breakdown, the intermediate layer resistance (described further below), and they are also used to make electrical contact with the thin-film stack that ultimately becomes the resonating structure. In the case of the bottom layer electrode, the electrode placement comes after a hole is opened in the top layer and the intermediate layers via reactive ion etching. In a CMOS process, the electrodes would be established to the thin-film stack through multiple metal layers and vias (interconnects). This complication was avoided in a prototype device owing to the flexibility of the fabrication process at CNF. Many variations are possible. For example, other layers could be grown or deposited atop the top-most layer that would not necessarily contribute to the transduction mechanism described below (but which may be necessary or useful in making electrical contact to the thin-film structure).

The intermediate layers in the film stack described herein may be grown, deposited, manufactured, or otherwise treated in such a way as to have a stress-dependent resistance or conductivity. In an exemplary prototype device described herein, the intermediate film is silicon dioxide which is thermally grown upon the preceding film layer, which is highly doped polysilicon. Initially, the intermediate silicon dioxide layer is highly resistive (essentially infinite, see FIG. 9). This film can be treated such that the resistance drops to on the order of kilohms and exhibits stress-dependent characteristics. Two methods have explicitly been used to "treat" the highly resistive silicon dioxide in order to render it less resistive and stress-dependent. One method consists of applying a large voltage across the film, via electrical contacts on the top and bottom layers (see FIG. 9). Above a certain breakdown voltage, the resistance of the silicon dioxide film irreversibly drops. Another treatment method includes releasing the thin-film mechanical stack using buffered oxide etch. Post-release, the silicon dioxide: (i) exhibits lower resistance than prior to the release; and (ii) has a higher gauge factor than prior to the release. While the thin-film may or may not exhibit stress-dependent resistance pre-treatment, the resistance is too high to be useful for transduction (the resistance is on the order of gigaohms or higher) because of the use of materials like silicon dioxide or silicon nitride. The various manufacturing and treatment processes discussed herein can be very helpful in enabling a thin-film that exhibits stress-dependent resistance that is on the order of kilohms such that transduction is possible. It is believed that the general approach of manufacturing a thin-film stack, with intermediate resistive layers, and treating or otherwise manufacturing those intermediate layers such that they exhibit stress-dependent resistance can readily be incorporated into a piezoresistive-like micro- or nanomechanical transduction mechanism.

The intermediate layers can be individually different or similar, and the method for treating the layers such that they ultimately exhibit stress-dependent resistance can be similar or different. In some embodiments of the present invention, silicon dioxide is grown on highly doped polysilicon. The silicon dioxide film thus formed likely has trapped dopants from the polysilicon and is susceptible to breakdown given the proper treatment (such as applying a large voltage across the film). Other intermediate layers may function similarly, thus the present fabrication method should not be narrowly viewed as one involving only polysilicon and silicon dioxide. Also, the method of lowering the resistance of the intermediate film via release with buffered oxide etch would work for other top and bottom conductive layer films as well as other intermediate layers. It is also likely that other release chemicals would work similarly to buffered oxide etch. Other release agents likely to work include, but are not limited to hydrofluoric acid, gas hydrofluoric acid, tetramethylammoniumhydroxide, ammonium hydroxide and potassium hydroxide, and other etchants commonly used in thin-film manufacturing for removing certain films (so called, sacrificial films).

Other, additional, or alternative methods could be used to treat the intermediate films such that they breakdown and exhibit stress-dependent resistance. Such methods include patterning of the top and/or bottom conductive layer films in such a way as to predispose the intermediate films to breakdown. For example, roughening the surfaces can prevent the intermediate films from growing uniformly or densely. As a further example, the manufacturing process can grow, deposit, or otherwise manufacture intermediate films with defects, dopants, or in a non-ideal method so as to facilitate electrical breakdown. Some treatment techniques that can be used to produce an intermediate layer film stack that exhibits finite resistance and stress-dependent resistance are as follows:

(i) Manufacturing the thin-film stack in such a way as to incorporate charge or dopants from the top or bottom film layers;

(ii) Roughening the top or bottom film layers in such a way as to promote electrical breakdown of the intermediate layers, or to promote stress-dependent resistance of the intermediate layers;

(iii) Using intermediate layers that are susceptible to breakdown given that the thin-film stack is released using an appropriate release agent;

(iv) Using intermediate layers that are susceptible to a particular applied voltage such that at the particular applied voltage the resistance of the film decreases or becomes stress-dependent (or both);

(v) Incorporating agents (such as dopants or chemicals) into the top and bottom films such that in response to an external trigger (such as an applied voltage), the agents migrate into the intermediate film stack and cause the resistance of the intermediate film stack to decrease or cause the resistance of the intermediate film stack to become stress-dependent; and/or (vi) Stressing the thin-film stack such that the intermediate layers electrically breakdown in the same manner as they do when a large dc voltage is applied to the top and bottom layers.

Some techniques for optimization of the thin-film stack to produce better transduction properties are as follows:

(i) Using intermediate layers with different intrinsic piezoresistive coefficients;

(ii) Fabricating adjacent intermediate layers with very different electrical properties (such as dopant concentration or electrical sign of the dopant material) such that pn-like junctions are formed in between adjacent films;

(iii) Doping of the intermediate layers;

(iv) Differentially doping the intermediate layers or the top and bottom layers; and/or (v) Creating out-of-plane structures extending to and from the top and bottom layers such that the intermediate films are disrupted in such a way as to promote conductivity between the top and bottom films, particularly in a motion or stress-dependent manner, and especially if such conductivity is triggerable through an external, post-processing event (including the release of the structures).

One possible aspect of this film-stack is that it exhibits, either as a result of manufacturing or post-process treatment, a moderately sized, (kilohms) stress-dependent resistance. In general, conventional thin-film stacks either do not exhibit, stress-dependent resistance or possess too high or too low a resistance to be effective at converting stress into voltage for transduction. The thin-film stacks of the embodiments described herein are good examples of "normal" thin-film stacks that are treated to produce a thin-film suitable for micro- and nanomechanical transduction. Prior to treatment, the thin-film stack has too large a resistance to be effective at conducting charge from the top layer to the bottom layer. The thin-film stack does exhibit stress-dependent resistance, but the resistance is still too high to be useful for transduction. After treatment (either via application of a large dc voltage or wet etch release using buffered oxide etch), the intermediate thin-film resistance is much lower and capable of conducting measurable charge across the top and bottom layers. A hard electrical breakdown occurs in the treatment process that creates conduction channels between the top and the bottom layers. While not "good" conductors (compared to, for example, metal conductors), the thin-film channels are sufficiently conducting as to produce suitable voltages for detect mechanical motion of the entire thin-film stack.

The film stack embodiments described herein, and for which data is presented, may be made of polysilicon, silicon dioxide, and polysilicon. Both polysilicon layers are highly doped and the silicon dioxide layer is thermally grown from the first polysilicon layer. Polysilicon is well established as a good micromechanical material, exhibiting frequencies in the MHz range and quality factors greater than 1000 for micronscale out-of-plane resonators. Other materials are also suitable for mechanical resonators and include silicon nitride or crystalline silicon. While we, have implemented the inventive transduction mechanism (described below) using an inter-polysilicon layer of silicon dioxide, other intermediate layers would work as well, such as silicon nitride, or conventional piezoresistive materials, such as piezoresistive metals like gold.

Figure 7:
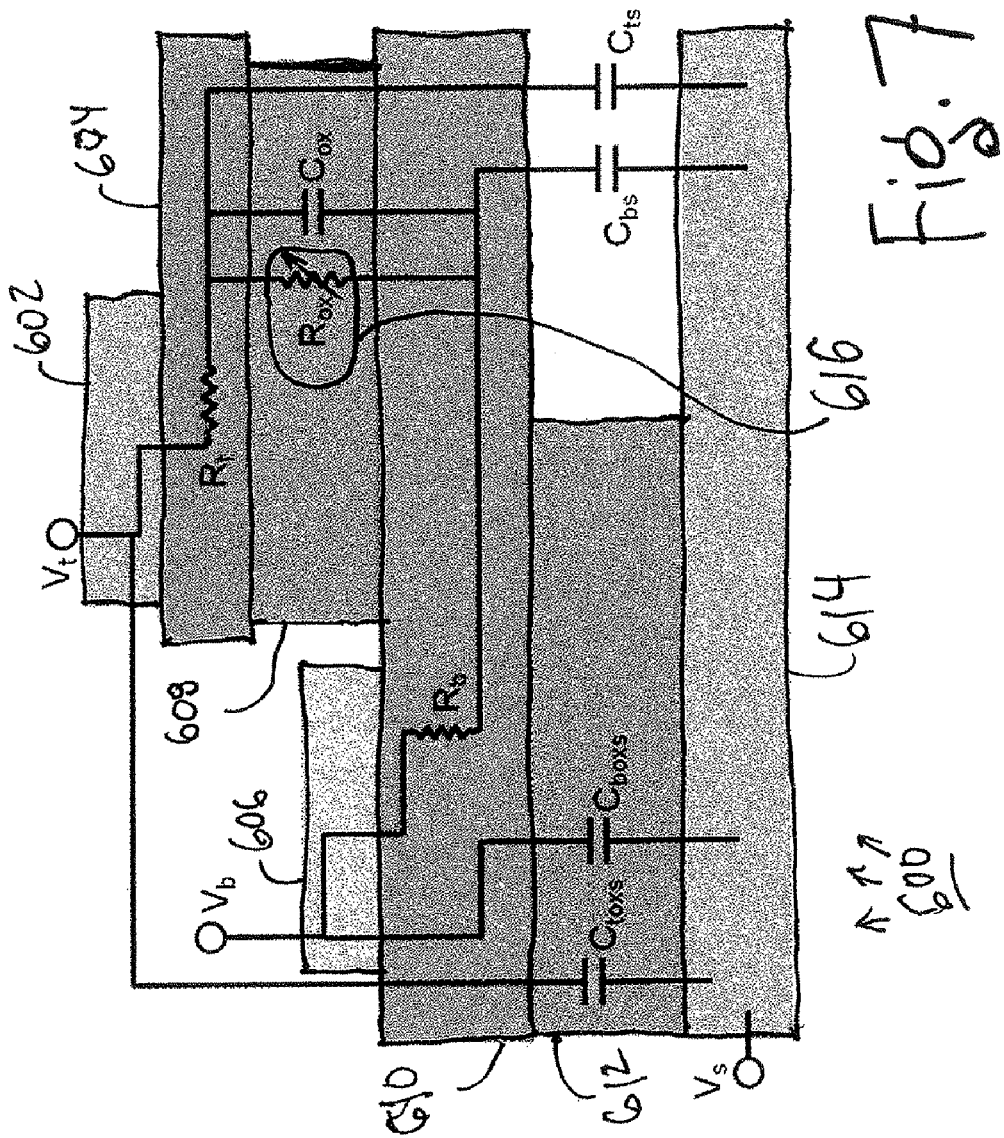
FIG. 7 is a cross-sectional view (cross hatching omitted for clarity) of a third embodiment of a device according to the present invention.
Figure 8:
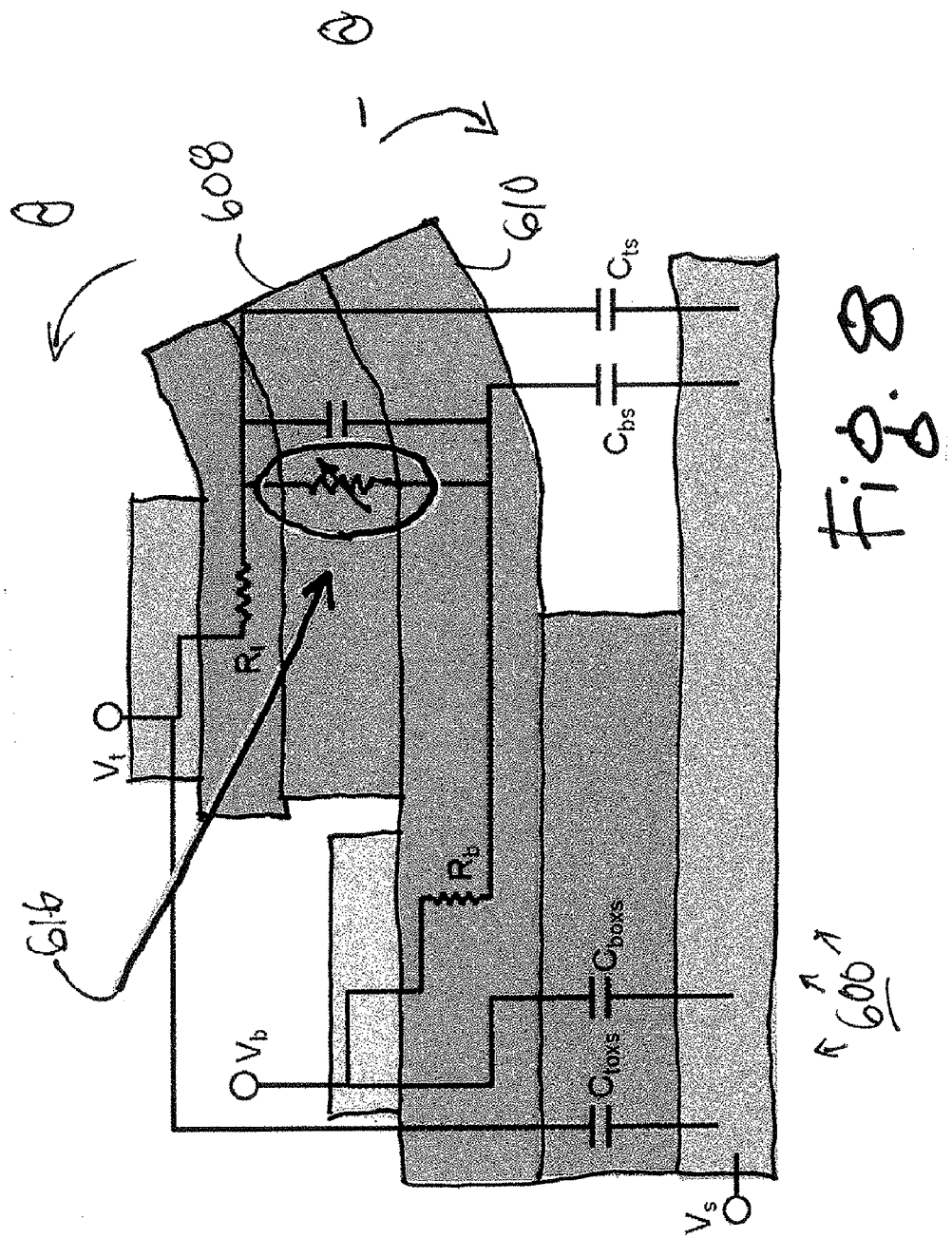
FIG. 8 is another cross-sectional view (cross hatching omitted for clarity) of the third embodiment device.

Transduction of the mechanical motion of the resonator results from current flow across a modulated resistor. The modulated resistor in, the prototype device is the inter-polysilicon layer silicon dioxide film, and the micromechanical resonator consists of the three film stack of polysilicon/silicon dioxide/polysilicon. A dc-bias is applied to a top and bottom layer film (the specific location the top film and the bottom film in the stack is generally unimportant; what is more important is that: (i) the current path lie along a cross-plane direction; and (ii) there is an intervening layer (or layers) whose resistance varies with stress or tension as experienced during mechanical motion). In piezoresistive embodiments of the present invention, the dc-bias applied to the top and bottom conductive layers should be different, such that there is a voltage difference between the top and bottom conductive layers. Owing to the finite resistance of the prepared or treated intermediate layer or layers, there is a current between the dc-biased layers. When the entire film stack moves, stress in the film stack (and in each of the layers) causes the resistance of the intermediate layers to change. The modulated resistance directly translates into a change in the charge and thus voltage measured at the detector. In this manner, mechanical motion of the film stack is directly translated into voltage that can easily be detected by a standard voltage detector. FIG. 7 shows the electrical model of the film stack of a prototype device when the film is stress-free. FIG. 8 shows the variable resistance caused by stress in the film stack. Note that for films that are not suitably prepared or manufactured, the static resistance between the top conductive layer and the bottom conductive layer shown in FIG. 7, or the variable resistance between the top and bottom conductive layers shown in FIG. 8, is too high to be useful in conducting charge from the top layer to the bottom layer. Embodiments of the present invention may have both: (i) a cross-plane conduction path through a piezo layer; and (ii) have been subject to methods described herein for decreasing piezo layer resistance and/or increasing piezo layer gauge factor. For example, in some embodiments, the gauge factor of a piezo layer may be increased to make a material piezoresistive that might not normally be considered a piezoresistive material (for example, silicon dioxide; silicon nitride). In some embodiments, a gauge factor of the piezo layer is increased from less than 0.1 to greater than 0.1. That is not to say that the inventive treatment methods disclosed herein are necessarily limited to transducer type devices having a piezo layer with a cross-plane current path—for example, the some inventive treatment methods of at least some aspects of the present invention may have useful application for in-plane current path devices having a piezo layer.

Figure 9:
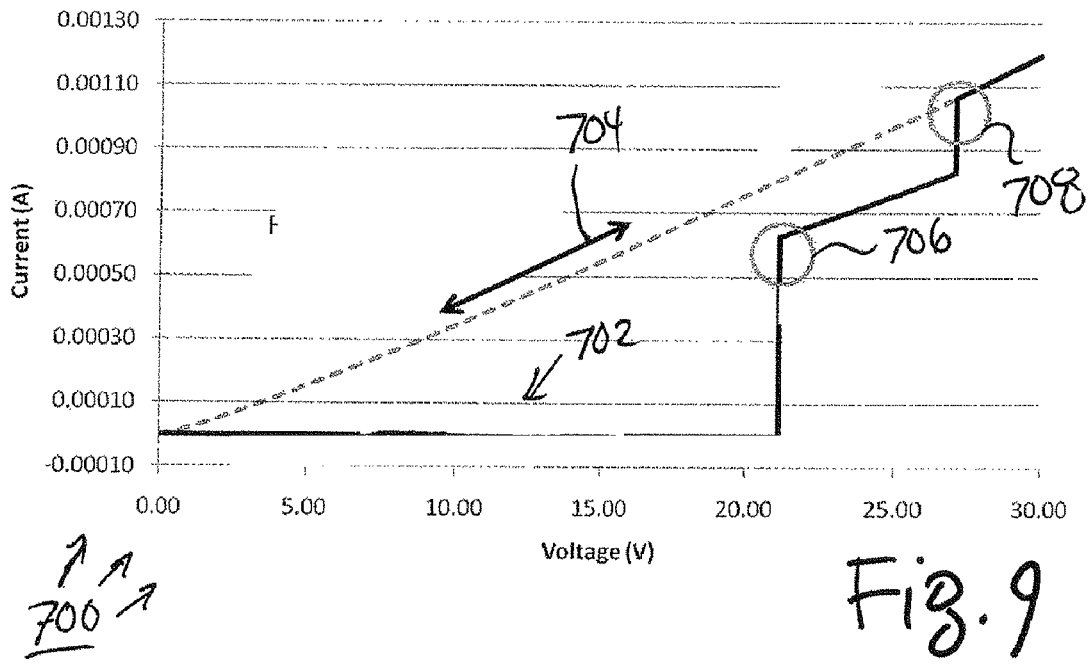
FIG. 9 is a graph showing current versus voltage characteristics of an embodiment of the present invention.
Figure 10:
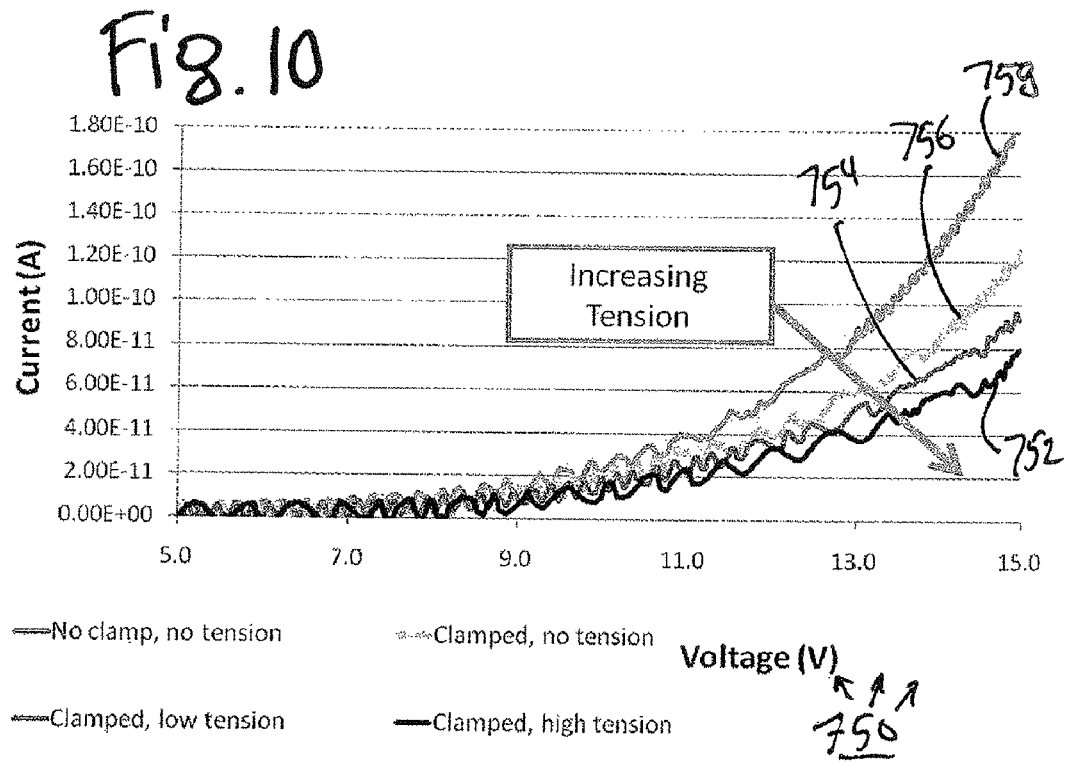
FIG. 10 is a graph showing current versus voltage characteristics of various embodiments of the present invention.

In FIG. 9, data is presented showing the electrical characteristics of the specific resistor layer used in the prototype device. At low dc voltages, the resistance between the polysilicon layers is nearly infinite. There is an intermediate regime of "soft dielectric breakdown" wherein if one reduces the voltage to below the soft breakdown threshold, one returns to the regime of nearly infinite resistance. There is also a hard breakdown voltage beyond which the dc resistance between the two polysilicon layers is on the order of 10 kohms-100 kohms for the prototype devices we have tested. It is noted that somewhat lower or higher resistances in the resistor layer are compatible with this transduction mechanism. In, general, it has been observed that lower resistance films exhibit greater transduced signal. It is expected that intermediate layers with resistances on the order of kilohms would be ideal from mechanical motion transduction due to the current and heat capacity limits of micro- or nanomechanical devices. The dc modulation of the resistance of the resistor layer is shown in FIG. 10. In FIG. 10, it is shown that by applying tension or stress to the device (described qualitatively in this experiment) one changes the resistance of the layer. Specifically, the conductance is shown to decrease as stress is increased. Note, however, that even though the thin-film is shown to be stress-dependent, the resistance is still too high to be useful in transduction (the resistance is still too high). The breaking down of the resistance to the low resistance regime via an external trigger can be helpful in making effective and efficient transducer devices.

Figure 11:
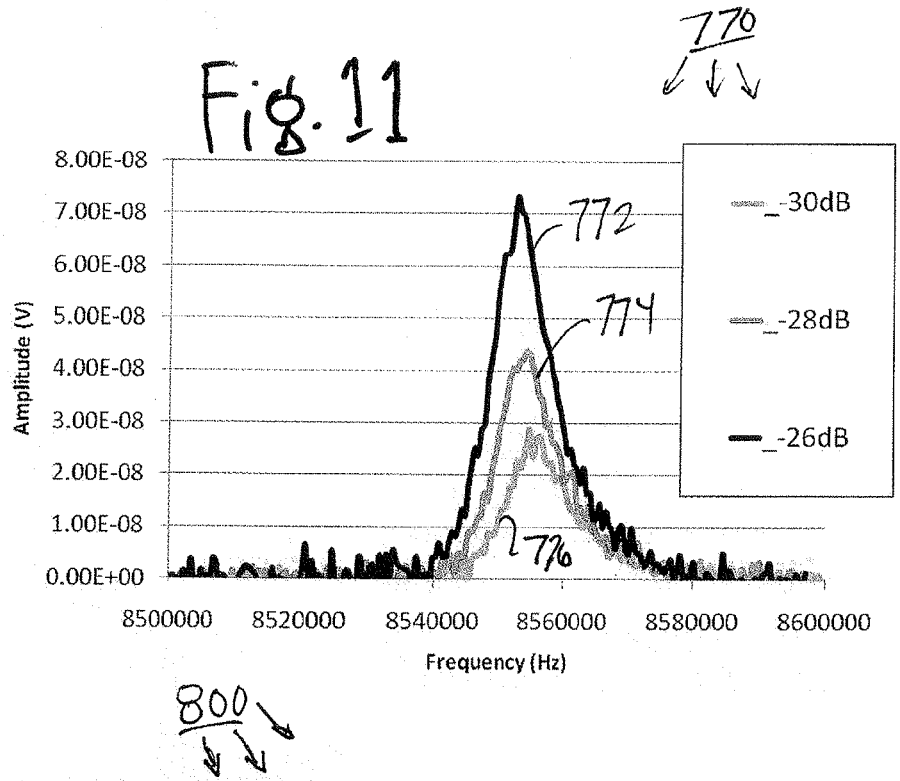
FIG. 11 is a graph showing amplitude versus frequency characteristics of an embodiment of the present invention.

In general, it is challenging to develop electro-mechanically integrated detection techniques for detecting mechanical motion of micro- and nano-mechanical resonators (sometimes called microelectromechanical systems (MEMS) or nanoelectromechanical systems (NEMS)). The difficulty in detecting motion is generally increased as the overall size of the device is decreased (thus, generally rendering NEMS more challenging to detect than MEMS). The method of creating or treating thin-films described herein and the resulting transduction mechanism overcomes this challenge in any system for which it is possible to design and implement a multi-film stack. Data showing electrical drive and detection using the modulated resistance technique is presented in FIG. 11. Here, a series bridge structure 800 was driven and detected, as shown in the scanning electron micrograph of FIG. 12. There are six bridges 802 in the series circuit between the bond pads on the left 804 and the bond pads on the right 806 side of the micrograph image of FIG. 12, Each bridge exhibits its own resonance frequency (and harmonics thereof), but only one such resonance is shown in FIG. 11. FIG. 13 is a schematic showing the electrical configuration of the drive and detection electrodes, and it shows the associated electronics used to perform the experiment of FIGS. 11 and 12.

Figure 16:
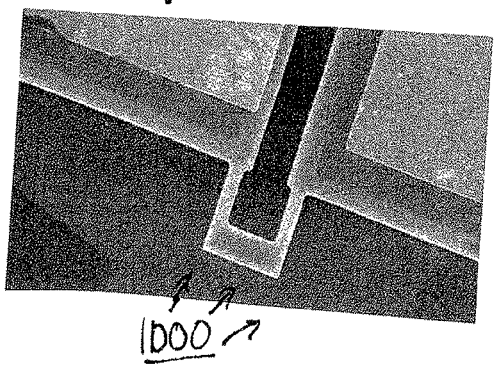
FIG. 16 is an orthographic top view of a sixth embodiment of a device according to the present invention.
Figure 17:
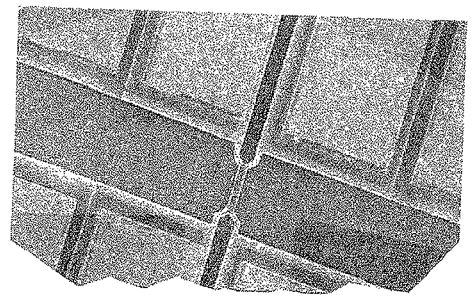
FIG. 17 is an orthographic top view of a seventh embodiment of a device according to the present invention.
Figure 18A:
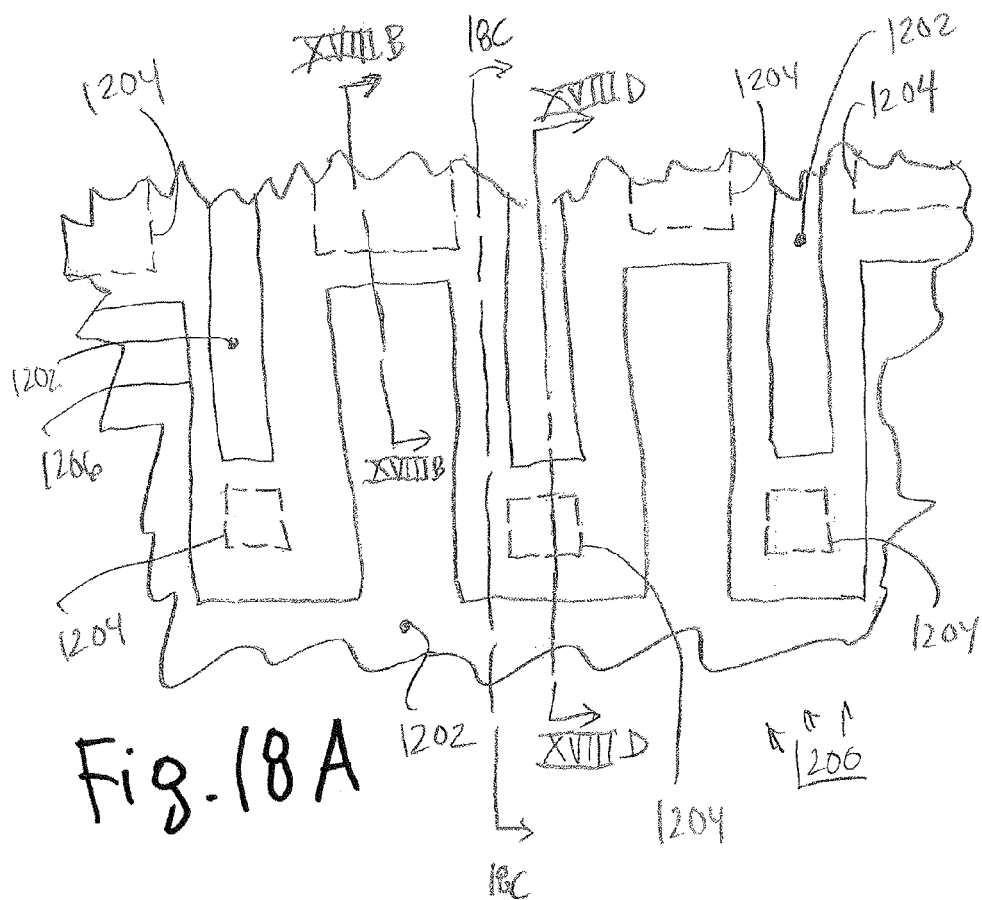
FIG. 18A is an orthographic top view of an eighth embodiment of a device according to the present invention.
Figure 18B:
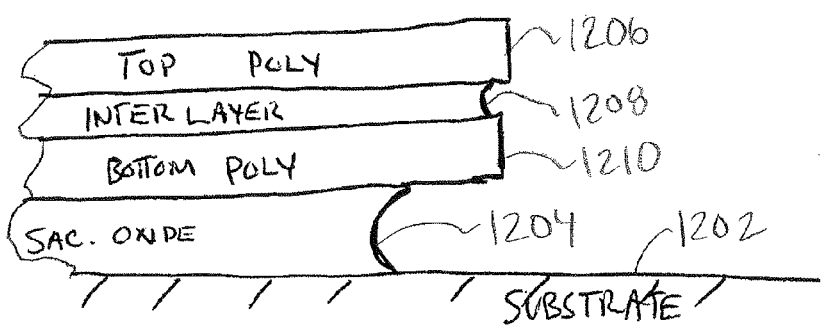
FIG. 18B is a cross-section of FIG. 18A.

The prototype device for which data is presented is a series bridge structure. However, it is possible to implement the treatable film-stack and transduction mechanism using other device geometries. Many of the transducers disclosed herein have: (i) a cross-plane current path through a piezoresistive layer; and, (ii) structure that allows the piezoresistive layer(s) (often along with adjacent conductive layer(s)) to move in an out-of-plane direction. FIGS. 16 and 17 show scanning electron micrographs of structures that could be manufactured incorporating this transduction mechanism. As shown in FIG. 16, device 1000 includes a single "U"-shaped cantilever structure including three thin-film layers arranged in a laminate structure. The three layers are (i) polysilicon (a conductive layer); (ii) silicon dioxide (that is, a piezo layer, more specifically a stress dependent layer, and even more specifically a piezoresistive layer); and (iii) polysilicon (that is, another conductive layer). Electrical contacts on the left and right are isolated through the cantilever. As shown in FIG. 17, device 1100 includes a single bridge structure having a laminate structure described above in reference to device 1000. Electrical contacts on the left and right are isolated through the anchor of the bridge ("V" shape) and contacts on the opposite sides of the bridge (top, bottom) are isolated through the bridge structure. Other device geometries are possible as well.

A prototype device according to at least some aspects of the present invention has yielded experimental results on its operation using a thin-film stack manufactured at CNF and treated at CNF. It should also be possible to treat thin-film stacks manufactured at conventional CMOS foundries to produce the same effects described herein in reference to the described embodiments of at least some aspects of the present invention. The film stack used to achieve the transduction is available in nearly all standard CMOS foundry processes. For example, one could implement the transduction mechanism using a three film stack consisting of gate polysilicon, isolation oxide, and capacitor polysilicon in a conventional 2-polysilicon layer CMOS process (for example, the 1.5 um AMIS ABN process which is available for multi-project wafer runs through the MOSIS foundry service). During the release process of such a MEMS-CMOS device, likely involving buffered oxide etch as in the prototype device described herein, the intermediate layer silicon dioxide film is likely to breakdown in a similar manner as the silicon dioxide film in the prototype device. Thus, the inventive methods of producing and/or treating thin-film stacks described herein are believed to be broadly applicable in the sense that they can be applied to devices manufactured in a variety of different environments.

Whereas at least some embodiments described herein implement the film-stack and transduction mechanism using polysilicon and silicon dioxide films, it may be possible to use different materials, or even to omit the conductive layers from the laminate structure. A non-exhaustive list of suitable film materials includes: single crystalline silicon, silicon nitride, polysilicon, silicon dioxide, and metallic films such as aluminum, gold, or chrome. Some of these film materials are more or less available in a standard CMOS foundry process, but all are usable in a custom process.

The film-stack and resulting transduction mechanism is ideally suited for any application requiring an easy-to-integrate transduction mechanism for a micro- or nano-mechanical moving structure. MEMS and NEMS are excellent examples of structures that would be well served by such a transduction mechanism. Specific MEMS and NEMS applications for which the modulated resistance transduction mechanism is well suited include, but are not limited to: resonators, oscillators, reference oscillators for timing applications, sensors, filters, and switches. Conventionally, in order to get signal from moving structures in these types of applications, a certain amount of effort (often quite a bit) must be exerted to figure out how to measure the signal from the motion of the device. The challenge is typically caused by the small transduced voltage (for capacitive detection of MEMS and NEMS) or the impedance mismatch between standard electronics and the motional resistance of the MEMS or NEMS device (typically standard electronics have impedances of about 50 ohms while MEMS/NEMS devices have motional impedances typically in the 100 kohm-Mohm range). The film-stack and resulting transduction mechanism described herein is simple to implement in that it relies primarily upon the dc bias between two films and the moderate finite resistance of any film layers between the two sensing films. As both the dc bias and the resistance of the intermediate film layers are relatively simple to control, this technique is a substantial improvement over prior methods. It is possible to "tune" the response by dynamically adjusting the dc bias on the sensing layers. This tuning of the response would be particularly useful in feedback loops in order to create self-sustaining feedback loops or to prevent over-driving of the devices. The methods for preparing the thin-film stack or treating it post-production are straightforward to implement, thus rendering the technique readily suitable for a variety of devices and therefore applications.

The methods of at least some aspects of the present invention, as described above, can lead to easy implementation of a transduction mechanism of mechanical motion of micro- and nano-mechanical structures. Additionally, several embodiments of transducer type devices according to at least some aspects of the present invention have been mentioned above and will be further discussed below. Data establishing the effectiveness of the transduction mechanism that results from the preparation or treatment of the thin-film stack in the manner proscribed is also discussed herein. The method of manufacturing or treating the thin-film stack is, at least in some embodiments of the present invention, simple to implement and requires little or no additional effort over and above existing methods of micro- and nano-mechanical device production. The resulting transduction mechanism may potentially be easy to implement and produces substantial signal without the need to use impedance matching electronics. In general, the mechanism might be incorporated in a film stack with one or more of the following properties:
   (i) Multiple film layers;
   (ii) a "top" layer that is conducting;
   (iii) a "bottom" layer that is conducting;
   (iv) the bottom and top layers (as noted above) being separated by at least one intermediate film layer with a finite resistance;
   (v) as many intermediate film layers as desired, the restraint being that there must be conduction between the top and bottom layers, and the intermediate film layers must exhibit (collectively) stress-dependent resistance; and/or
   (vi) the film stack must be such that the top and bottom layers are isolated from each other and can be contacted with isolated electrical connections.

Typical sorts of devices in which this thin-film stack and the resulting transduction mechanism could be used include:
   (i) Resonators;
   (ii) oscillators;
   (iii) reference oscillators;
   (iv) sensors;
   (v) filters; and/or
   (vi) switches.

Some of the advantages that some embodiments of this transduction mechanism may have over conventional transduction methods may include:
   (i) Ease of implementation in a thin-film stack;
   (ii) ease of implementation in a CMOS foundry process;
   (iii) ability to be implemented directly in the thin-film stack of the micro- or nanomechanical structure as opposed to distant from the micro- or nanomechanical structure;

(iv) ability to be implemented directly in a thin-film stack as opposed to being a separate chip or component that must be separately bonded or contacted to the micro or nanomechanical structure or chip;

(v) compatibility with standard electronics such that impedance differences (and impedance matching) is not an issue;

(vi) the lack of the need to amplify the transduced signal to get generally measureable signal levels using a standard network analyzer detector;

(vii) the linearity of the transduction mechanism generally over the entire range that the micro- or nanomechanical structure exhibits linear motion;

(viii) the ease of tuning the output from the transduction mechanism through variable dc-bias on the top or bottom films; and/or (ix) the ease of controlling the transduction mechanism through the use of various thin film materials either as the top and bottom layers or as the intermediate layers.

Part Two: Discussion with Extensive Reference to the Figures

FIG. 4 shows a transducer type device 300 including: a thin-film stack 301 and an additional hardware set 303. FIG. 4 shows a side-view schematic of a thin-film stack 301 suitable for transducing mechanical motion as described herein. Stack 301 includes: poly2 layer 302; inter-layer oxide—gate oxide layer 304; poly1 layer 306; sacrificial oxide—field (or isolation oxide) layer 308; and substrate layer 310. This is the thin-film stack used specifically in at least some of the prototype devices described herein and manufactured at the CNF. Thin-film stack 301 is operatively connected to the additional hardware in order to provide additional kinds of functionality associated with various transducer type devices. For example, depending on its structure and/or programming, additional hardware set 303 may allow device 300 to act as one or more of the following transducer type devices: a resonators; an oscillator; a reference oscillator; a sensor; a filter; and/or a switch.

Poly2 layer 302 and poly1 layer serve several functions, including: (i) providing mechanical support for piezoresistive layer 304; (ii) serving as electrical contacts on opposing major surfaces of piezoresistive layer 304; and (iii) determining the resonant frequency for vibrations in stack 302, 304, 306. Because the poly1 layer 306 and poly2 layer 304 serve as electrical contacts on opposing major surfaces of piezoresistive layer 304, the current path(s) through layer 304 will be cross-plane current paths. Because poly1 layer 306 and poly2 layer 302 determine the resonant frequency, these layers can be designed to make resonators having predetermined resonant frequency(ies).

Figure 5:
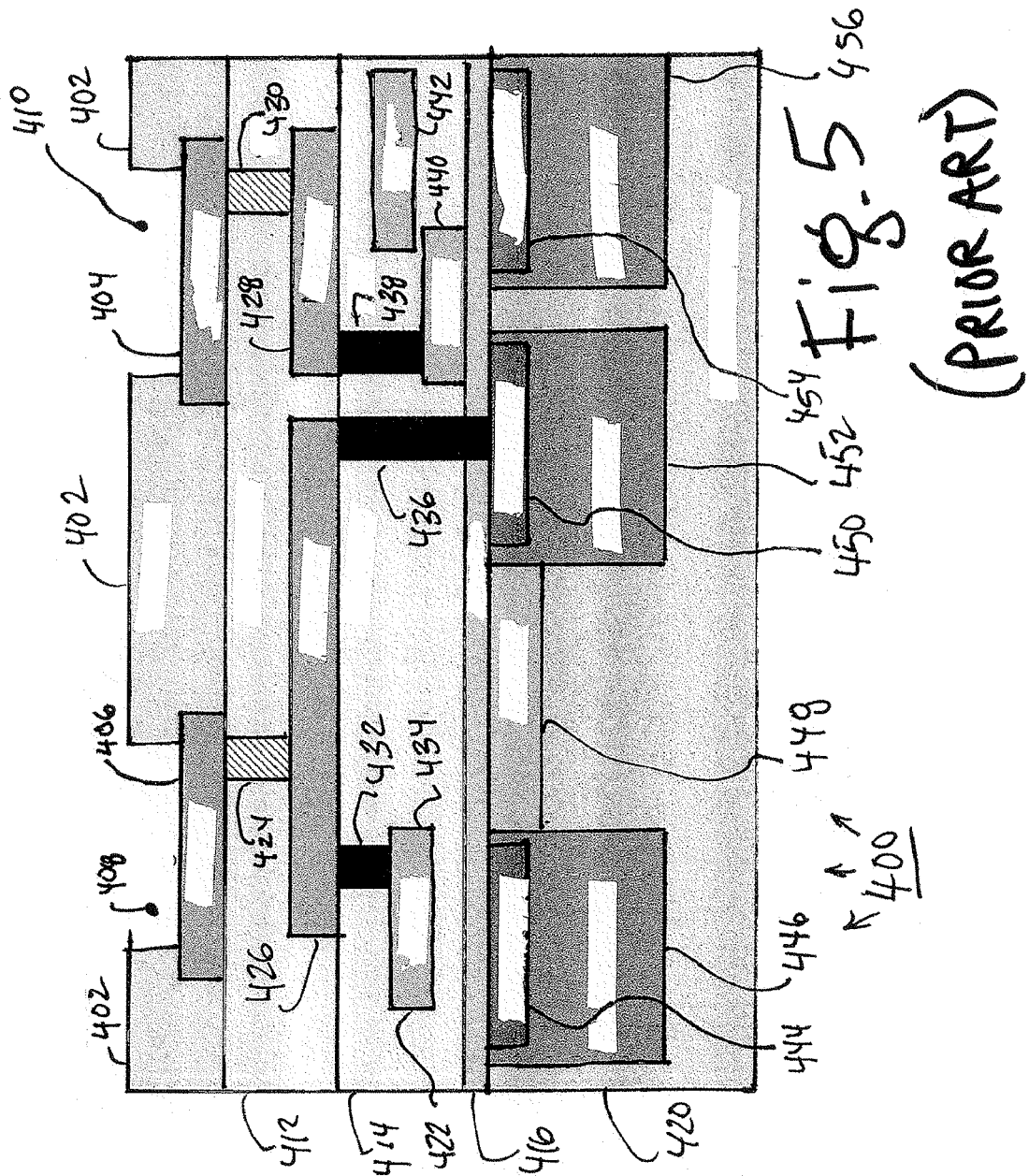
FIG. 5 is a cross-sectional view (cross hatching omitted for clarity) of a prior art stack structure helpful for understanding the present invention.
Figure 6:
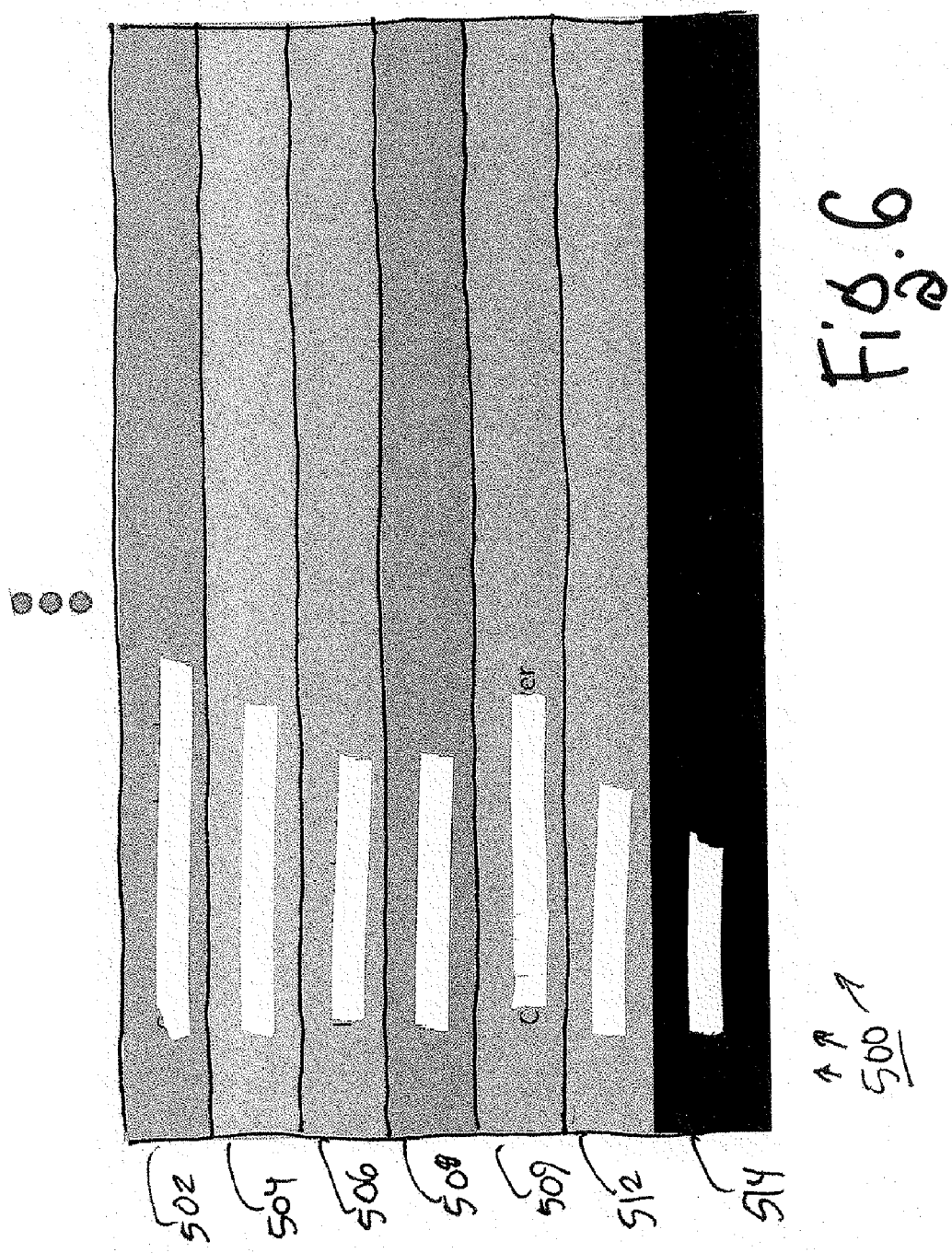
FIG. 6 is a cross-sectional view (cross hatching omitted for clarity) of a second embodiment of a device according to the present invention.

FIG. 5 is a schematic of a prior art thin-film stack 400 in a typical, standard. CMOS foundry process. Stack 400 includes first insulator layer 402; first metal2 portion 404; second metal2 portion 406; glass cuts 408, 410; second insulator layer 412; third insulator layer 414; gate oxide layer 416; silicon substrate 420; first poly2 portion 422; first via 424; first metal1 portion 426; second metal1 portion 428; second via 430; contacts 432, 436, 438; poly1 portion 440; second poly2 portion 442; n or p implants 444, 450, 454; n or p wells 446, 452, 456; and FOX portion 448. Note that near the substrate are the same layers found in FIG. 4 and in the prototype devices.

FIG. 6 is a schematic of a generic thin-film stack 500 that is an example of the thin-film stack described herein that may be used to implement the transduction mechanism described herein. Stack 500 includes conductive upper device layer 502; first intermediate layer 504; second intermediate layer 506; third intermediate layer 508; conductive lower device layer 509; sacrificial layer 512; and substrate 514. The top and bottom layers are conductive over their entire respective areas. In embodiments of the invention, the location of the cross-plane current path through the conductive layers, and through the piezo layer(s) in between them, may depend upon the location of contacts connecting the conductive layer(s) into a circuit. Regardless of the location of the current path, it will lie along a cross-plane direction so long as the conductive layers are on opposite sides of the piezo layer (or laminate stack of multiple piezo layers). Intermediate layers will have finite resistances either as a result of manufacturing or as a result of post-process preparation and (collectively) exhibit stress-dependent resistance.

FIGS. 7 and 8 show stack 600 including: upper contact 602; upper conductive layer 604; lower contact 606; piezoresistive layer 608; lower conductive layer 610; cantilever support layer 612; and substrate 614. As shown in FIGS. 7 and 8; the piezoresistive layer is characterized by a stress-dependent resistance, which is symbolically denoted as a potentiometer. Other electrical symbols in FIGS. 7 and 8 show other salient electrical characteristics or relationships between respective portions of the thin-film stack 600. FIG. 8 shows an electrical model of thin-film stack 600 when it is under stress (specifically, compressive stress at its upper major surface and tensile stress at its lower major surface. Stack 600 exhibits out-of-plane motion, and, more specifically, vibrates rotationally in the $\theta$ and $-\theta$ angular directions.

Graph 700 of FIG. 9 includes: infinite resistance region 702; finite resistance in post-breakdown regime 704; soft (reversible) breakdown voltage 706; and hard breakdown voltage 708. This data shows the finite resistance of the intermediate layer in the prototype devices. For silicon dioxide piezoresistive layers, there has been observed a soft electrical breakdown regime and a hard electrical breakdown regime. In the soft breakdown regime, lowering the applied dc voltage resulted in a return to the nearly infinite resistance found at low applied dc voltages. Beyond the hard breakdown point, the device was always observed to exhibit finite resistance and never returned to the nearly infinite resistance regime.

Graph 750 of FIG. 10 includes: clamped, high tension curve 752; clamped, low tension curve 754; clamped, no tension curve 756; and no clamp, no tension curve 758. The data shows the stress-dependent resistance of the intermediate film used in the prototype devices (silicon dioxide). As stress is increased, the resistance of the intermediate layer is increased.

Figure 15:
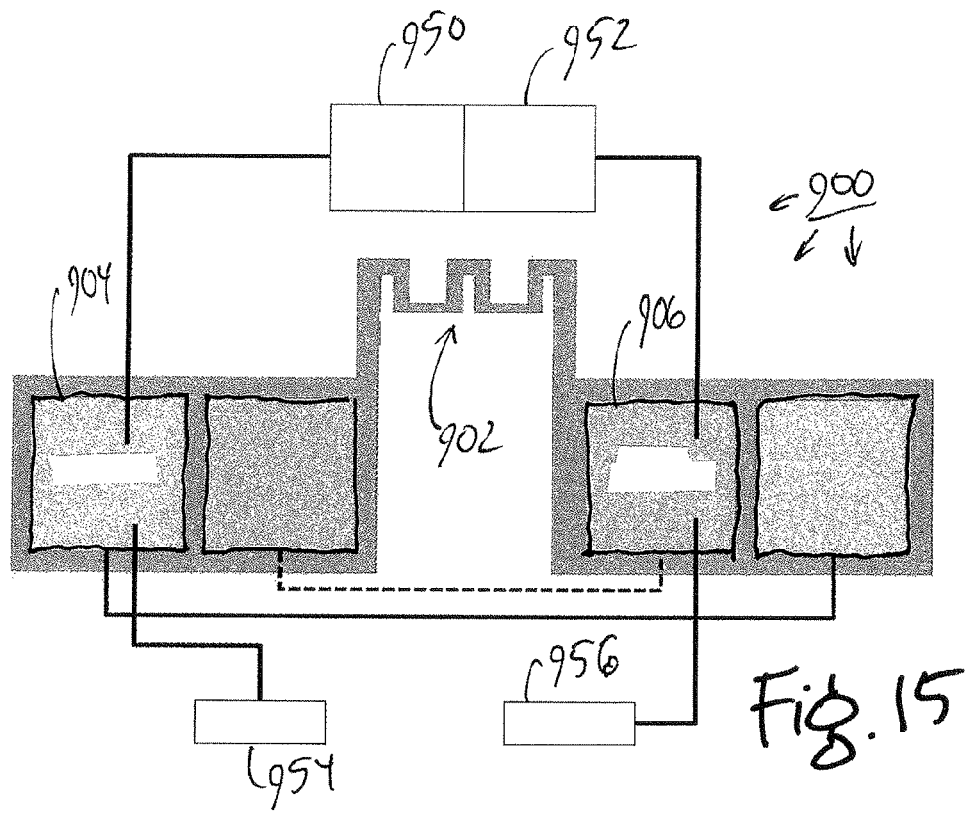
FIG. 15 is another schematic view of the fifth embodiment device.

Graph 770 of FIG. 11 includes: −26 dB curve 772; −28 dB curve 774; and −30 dB curve 776. The data was observed from operation of a prototype device where the transduction mechanism had a bridge structure. A differential bias voltage of 24.4V is applied between the top and bottom layers. The applied ac-power (50 ohm reference) is shown in the legend. FIGS. 13 to 15 show schematics of the full experimental setup.

Figure 12:
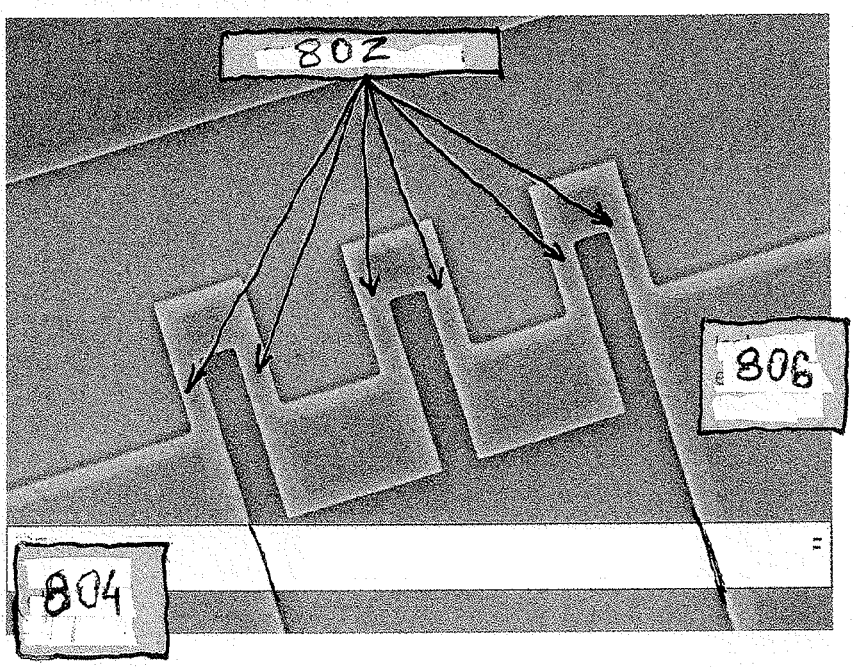
FIG. 12 is an orthographic top view of a fourth embodiment of a device according to the present invention.

FIG. 12 shows a scanning electron micrograph (at slight angle) of the six-bridge prototype device 800 tested and described herein. Device 800 includes: six (6) bridges 802; first isolated electrical contact 804; and second isolated electrical contact 806. Electrical contacts to the mechanical device and film stack are made at pads (not shown) on the lower left and right sides of the image (see FIGS. 13 to 15).

FIGS. 13 and 14 respectively show top—(FIG. 13) and side—(FIG. 14) view schematics of the electrical configuration 900 of the prototype device for the experiments described herein. Configuration 900 includes: multi-bridge resonator 902; drive 904; detect 906; metal bond pads 908; detector 910; first polysilicon layer 912; piezo layer 913; second polysilicon layer 914; oxide layer 918; substrate 920; and electrical ground path 922. The ac drive voltage can be applied between the bottom layer and the substrate (shown in FIG. 14) or between the top layer and the substrate. Both the top and bottom layers are dc-biased. The layer (top or bottom) not used for contact with the drive voltage is probed to detect the motion of the mechanical structure (FIG. 15).

FIG. 15 shows the experimental configuration 900 used to test a prototype device. This configuration further includes: network analyzer (ac drive) 950; network analyzer (input) 952; first DC bias 954; and second dc bias 956. A network analyzer is used to both drive (ac) and detect the transduced voltage from the mechanical motion of the thin-film stack. A dc-bias is applied to both the top layer and the bottom layer films.

FIGS. 16 and 17 show two scanning electron micrographs showing alternate mechanical structures 1000, 1100 incorporating the thin-film stack and transduction mechanism described herein. Shown are a "U"-shaped cantilever structure 1000 and a bridge structure with "V"-shaped anchor structure 1100. These are examples of geometries that allow out-of-plane motion.

Discussion will now move to the subject of a demonstration of piezoresistive transduction of mechanical motion from out-of-plane flexural micromechanical resonators made from stacked thin films. The resonators of this demonstration are fabricated from two highly doped polysilicon layers separated by an inter-layer dielectric. Two inter-layer materials have been examined, specifically: thermal silicon dioxide and stoichiometric silicon nitride. It has been shown that dielectric breakdown causes the film stack to function as a vertical piezoresistor effectively transducing the motion of the resonators. A gauge factor of ~5 has been obtained by the treatment methods described herein, which gauge factor is sufficiently large to directly detect the resonator motion. The simple film stack constitutes a vertically oriented piezoresistor that is readily integrated with micro- and nano-scale resonators.

One of the challenges of implementing micro- or nanomechanical structures in applications such as sensors or frequency determining communications elements is signal transduction from the resonant structure. This problem is increasingly severe as device sizes are scaled down to the sub-micron regime making capacitive coupling difficult and resulting in a drastic impedance mismatch between the mechanical device and conventional 50 ohm electronics.

Various approaches that attempt to address these MEMS and NEMS electrical integration challenges include: frequency conversion, novel piezoresistive strategies, or impedance matching circuitry. Some embodiments of the present invention take a structural approach to the electrical transduction problem. A vertically oriented piezoresistive transducer across multiple thin film layers is described herein. The structure uses layers present in nearly all CMOS foundry processes, and as such, is amenable to integration with minimal process disruption. A further advantage of this approach is that the piezoresistive transducer is integral to the resonator—there is no need to add thin metal films or perform ion implantation. This method is only limited by the lithography used to create the resonators and the properties and thickness of the inter-layer dielectric.

FIGS. 18A to 18D show a six-bridge structure common to p-sox-p and p-sn-p devices. Layer thicknesses in this example are: (pbottom-sox-ptop) 277 nm-53 nm-303 nm; (pbottom-sn-ptop) 280 nm-50 nm-106 nm. The gold bond pads are not shown in FIGS. 18A to 18D. FIGS. 18A to 18D show test structure 1200 including: substrate 1202; isolation layer anchor points 1204; top polysilicon layer 1206; piezoresistive interlayer 1208; bottom polysilicon layer 1210; and freedom of motion gap 1212. Experiments have been performed on test structure 1200, operated in a vacuum chamber at pressures below 1 Ton (typically 100-500 mTorr). Electrical connections are made to gold bond pads contacting the top and bottom polysilicon layers (not shown, but see similar pads in FIG. 35). The MEMS chip is wirebonded to a 24-pin DIP mounted in a vacuum chamber so that electrical connections to the chip and optical observations of the chip can be made simultaneously.

Two film stacks were used to create the devices; one consists of LPCVD polysilicon atop thermal silicon dioxide atop LPCVD polysilicon (p-sox-p), and the other is LPCVD polysilicon atop LPCVD silicon nitride atop LPCVD polysilicon (p-sn-p). Both stacks sit atop sacrificial silicon dioxide and a silicon handle wafer (FIGS. 20 to 23).

Optical methods have been initially used to investigate the mechanical properties of some resonators made according to at least some aspects of the present invention. For both stacks a range of Qs is observed from around 300 to a few thousand. For single layer polysilicon devices, Qs are generally observed to be in the thousands to tens of thousands.

Figure 20:
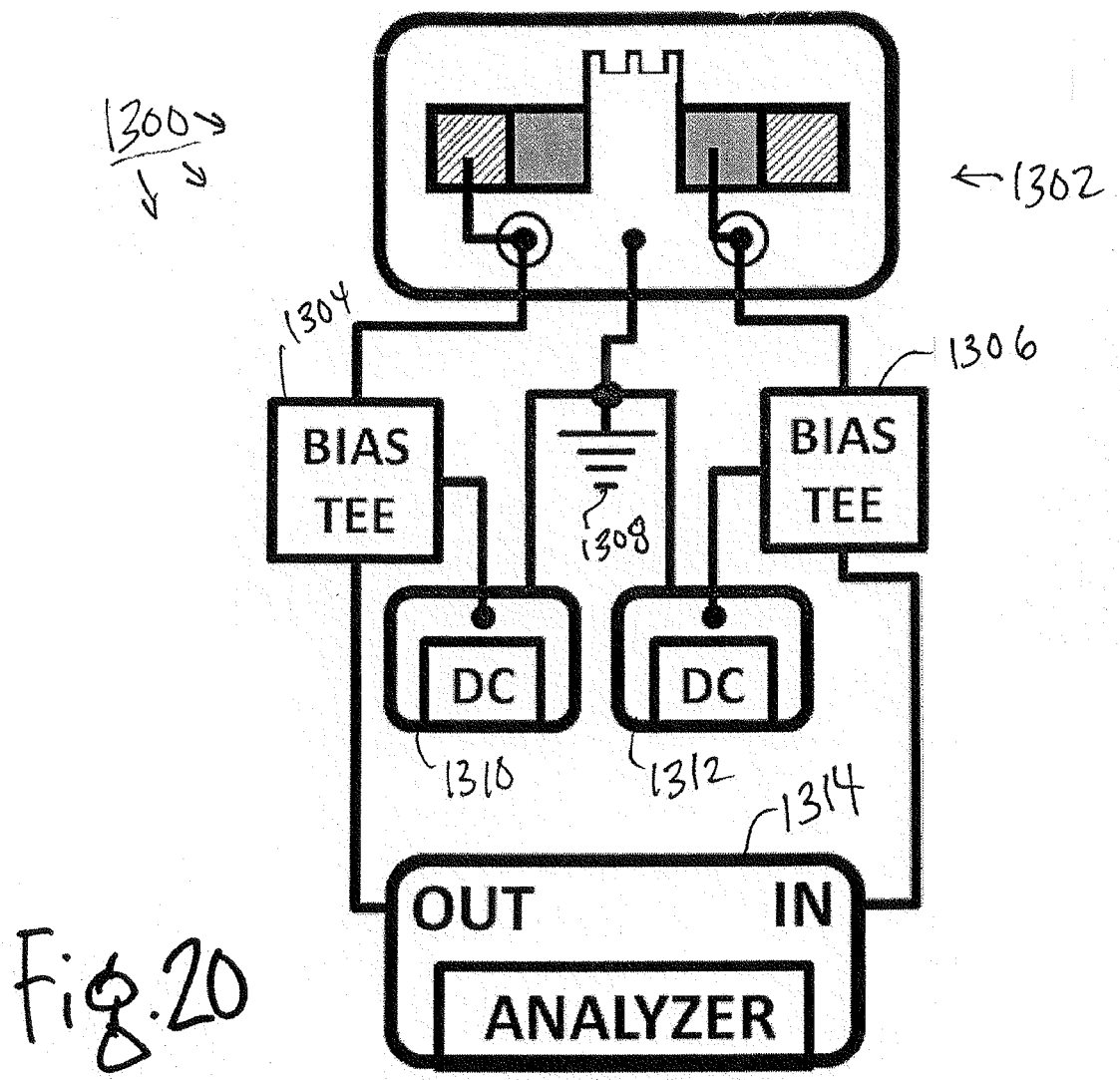
FIG. 20 is a schematic view of a tenth embodiment of a device according to the present invention.
Figure 21:
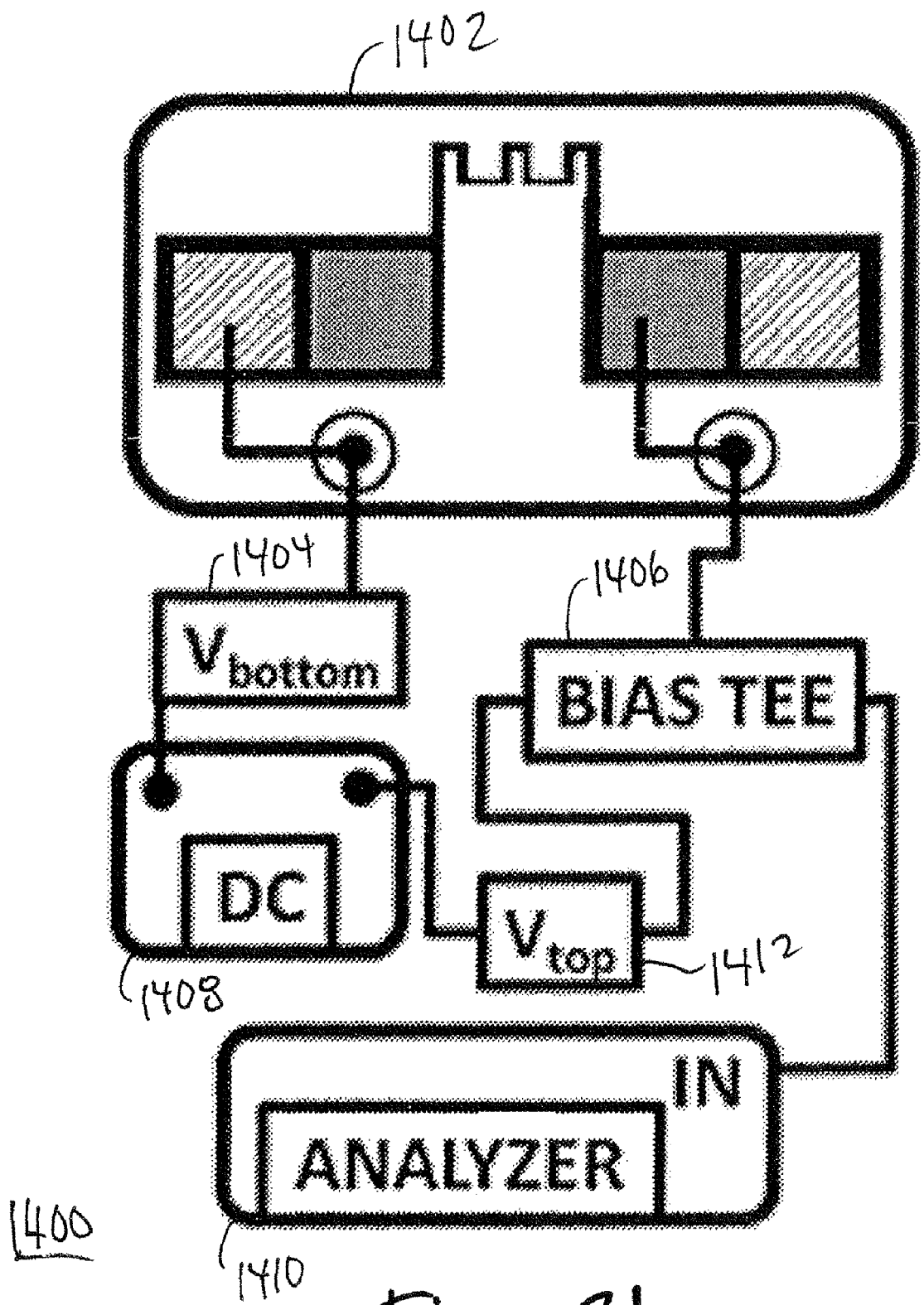
FIG. 21 is a schematic view of an eleventh embodiment, of a device according to the present invention.
Figure 22:
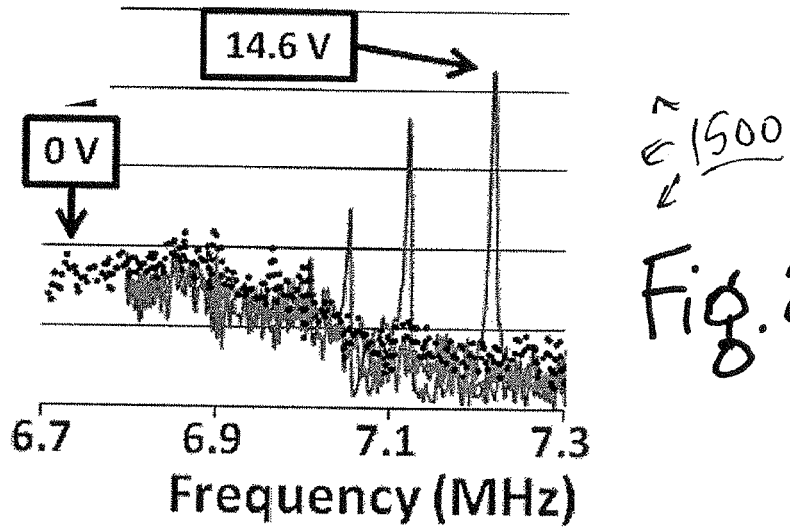
FIG. 22 is a graph showing frequency characteristics of embodiment(s) of the present invention.
Figure 23:
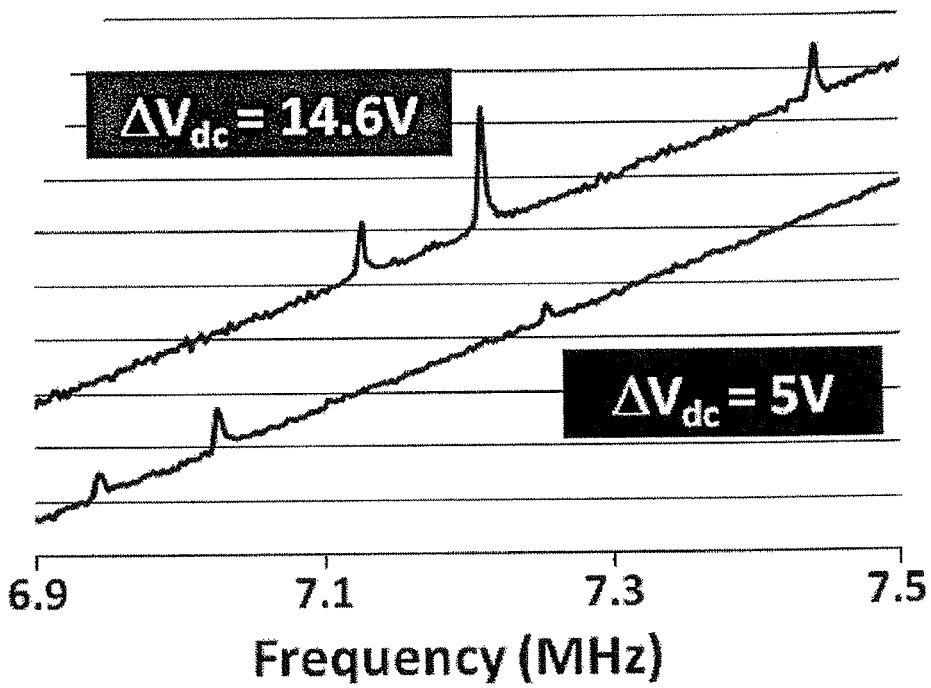
FIG. 23 is a graph showing frequency characteristics of embodiment(s) of the present invention.

FIGS. 20-23 show: (i) a schematic showing how the p-sox-p resonators are driven or detected with dc bias and ac input or output on two different ports (FIGS. 20 and 21); and (ii) data from optically driven and electrically detected resonators (FIG. 22); and (iii) results from electrically driving and detecting the resonators (FIG. 23). In FIG. 22, the substrate is grounded, and the bottom and top polysilicon layers have dc connections. The top polysilicon layer is connected to the input of the analyzer. The four curves show increasing voltage difference between the layers, from 0 V (dotted black) to 7 V, 11 V, and 14.6 V, and the corresponding increase in the resonance frequency of the devices. Both layers have dc bias connections, and the bottom layer is driven by the output of the analyzer, while the top layer is connected to the input of the analyzer. Both frequency and amplitude are seen to shift when the voltage difference between the layers is changed (the substrate is grounded). As shown in FIG. 20, device 1300 includes vibrating sub-assembly 1302; first bias tee 1304; second bias tee 1306; ground path 1308; first DC portion 1310; second Dc portion 1312; and analyzer 1314. FIG. 20 shows how ac and dc connections are made to the top and bottom polysilicon layers. Depending upon the particular experiment, not all connections are necessary. Typically, both electrical and optical experiments are performed with dc voltages applied on both the top and bottom layers, though one of the dc voltages may be set to 0 V.

FIG. 22 shows the results 1500 of an optical (theromoelastic) drive and electrical detection experiment on a p-sox-p device 1400. As shown in FIG. 21, device 1400 includes: vibrating portion 1402; V-bottom portion 1404; bias tee 1406; DC portion 1408; V-top portion 1412; and analyzer 1410. The top polysilicon layer is connected to a dc power supply and the input of the network analyzer. The bottom polysilicon layer is connected only to a dc power supply. As the potential difference is increased between the two layers, the detected signal strength and frequency increase in amplitude. Reversing the top and bottom layer potentials produces similar results, and no signal is observed with the potential difference is 0 V, nor when one layer is floating relative to ground.

The resonators can also be driven and detected electrically (FIG. 23 at reference numeral 1600; three of six peaks are shown in the spectra). No amplifier is used to enhance the detected signal; neither is there any impedance matching circuitry, nor any frequency up- or down-mixing. The sloping background signal is the result of electrical cross-talk across the thin insulating layer.

We measure the interlayer resistance (top to bottom polysilicon) to be on the order of $10^4$ k$\Omega$ up to a few M$\Omega$ for most of the p-sox-p devices tested. From any starting value, the interlayer resistance can be decreased to ~$10^4$ k$\Omega$ by applying interlayer voltages above a breakdown threshold of about 30 V for most p-sox-p devices.

Figure 24:
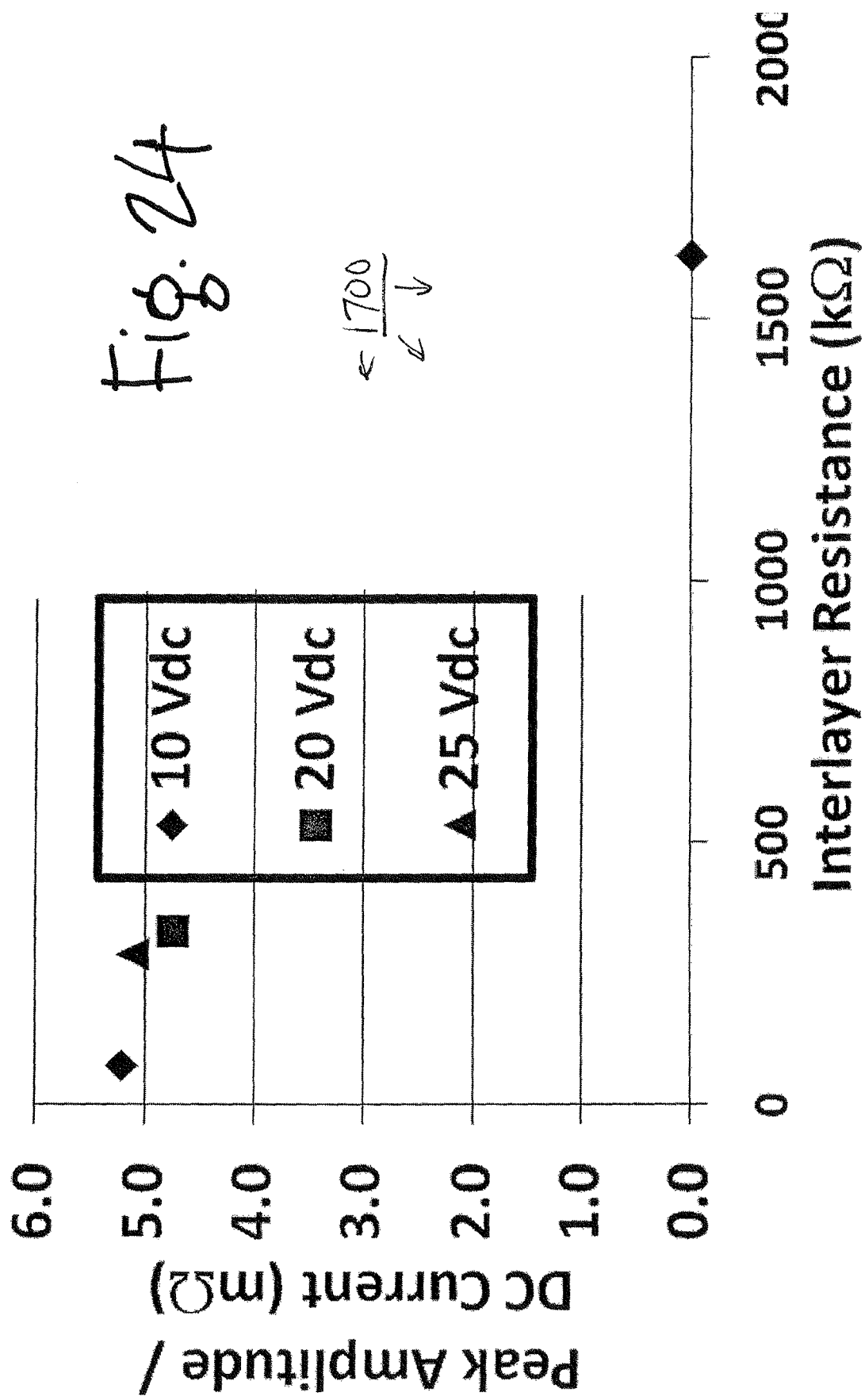
FIG. 24 is a graph showing amplitude versus interlayer resistance characteristics of an embodiment of the present invention operated at various voltages.

All experiments have also been performed using identical geometry resonators with intermediate layer silicon nitride. The p-sn-p devices are investigated to confirm that any undercut or damage to the interlayer silicon dioxide of the p-sox-p devices is not the primary cause of the transduction mechanism. FIG. 24 shows the results 1700 of a series of experiments on a single p-sn-p device. Data are the peak amplitude at resonance (electrical detection and optical drive) divided by the static current. The interlayer resistance is broken down by application of increasingly higher voltage differences across the polysilicon layers. Up to a 35 V difference is used to decrease the resistance from an initial value of 1.6 M$\Omega$ down to a final value of 74 k$\Omega$. At 330 k$\Omega$ and below we observe an electrical signal from the displacement of the resonators at their resonant frequency.

Figure 25:
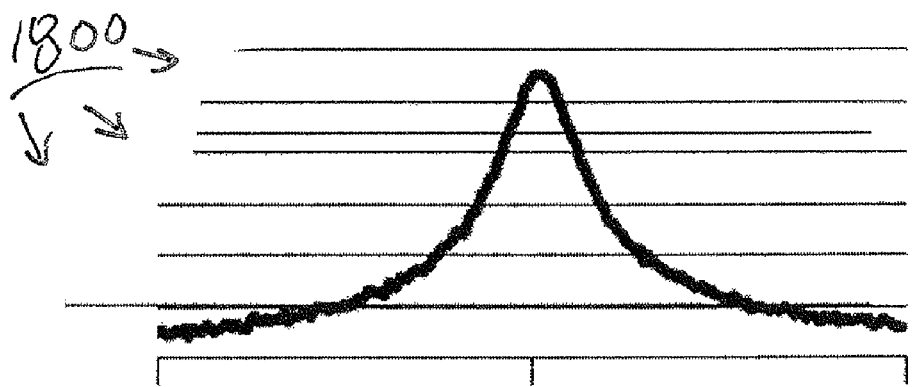
FIG. 25 is a graph showing frequency characteristics of embodiment(s) of the present invention.
Figure 26:
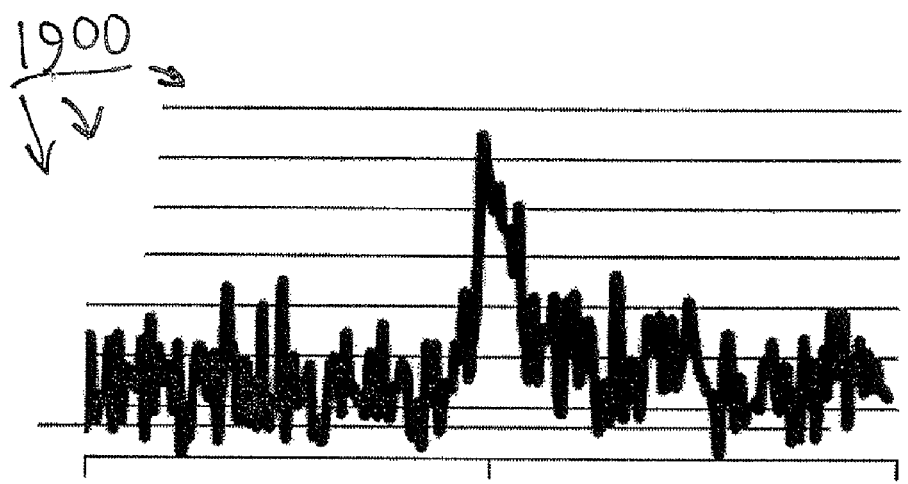
FIG. 26 is a graph showing frequency characteristics of embodiment(s) of the present invention.

FIGS. 24 to 26 show: (i) peak detected amplitude divided by dc current for p-sn-p devices as a function of interlayer resistance (FIG. 24); (ii) data from an optical drive and electrical detection experiment using p-sn-p devices (FIG. 26); and (iii) optical drive and optical detection of a p-sn-p resonator (FIG. 25). Data is from optical drive and electrical detection experiments. The peak amplitude from experiments similar to those of FIG. 25 is compiled in the graph in FIG. 24. Curve 1800, shown in FIG. 25, demonstrates a linear response of the resonator, while curve 1900, shown in FIG. 26, is non-linear. It has been necessary to drive the p-sn-p devices non-linearly to detect any signal electrically. An example of a peak 1900 used to generate the data 1700 for FIG. 24 is shown in FIG. 26. With p-sn-p devices, electrical signals are only detectable when the devices are driven in the non-linear regime. The transduction is apparently less for the p-sn-p devices than for the p-sox-p devices, which all exhibit stronger electrical peaks even in the linear regime. FIG. 25 shows results 1800 from a p-sn-p device driven (linearly) and detected optically.

The gauge factor can be estimated for the p-sox-p material by assuming that the piezoresistance arises from the geometric effect of squeezing and deforming the intermediate layer during out-of-plane motion of the resonator. The possible contribution to the gauge factor from the fractional change in resistivity can be disregarded to arrive at a gauge factor of:

$$\frac{dR}{R} \Big/ \frac{dh}{h} = \frac{dR}{R} \Big/ \left(\sigma \frac{dL}{L}\right) = \gamma,$$

where R is the resistance, h is the thickness of the entire film stack, L is the length of the double-clamped beam, and $\sigma$~0.2 is the Poisson ratio for the material (thermal silicon dioxide). In our configuration $dR/R = V_{ac}^{measured}/\Delta V_{dc}^{top\text{-}bottom}$, which is directly measured. $dL/L$ is calculated from the critical amplitude at which nonlinear motion occurs. Data on the transition from linear to nonlinear motion is obtained to relate the detected voltage to the critical amplitude of motion. For one device tested, the onset of non-linear motion begins at an ac drive amplitude between layers of about 40 mV (dc voltage between layers is 24.4 V). The critical amplitude for this device is ~8 nm, and the detected voltage of the nonlinear peak is 40 µV. From these values, the gauge factor is estimated to be ~5, and is certainly adequate to directly detect the motion of the resonators without the need for amplification, signal mixing, or impedance matching. This value compares favorably with other reported gauge factors for piezoresistive materials used to detect resonator motion.

We have fabricated and tested multi-layer resonators consisting of top- and bottom-layer polysilicon films with an intermediate insulating layer and shown that these devices can be detected electrically, whether driven electrically or optically. The piezoresistive transduction mechanism is vertically oriented through the film stack. The transduction is shown to be adequate for directly electrically detecting the resonant motion of the devices without the need for impedance matching circuitry or signal amplification. Furthermore, the transduction mechanism is indistinct from the resonator itself, so problems associated with scaling down device sizes are potentially avoided. This also greatly reduces the effort associated with fabricating a displacement transducer and affords the possibility of optimizing the transducer (via the intermediate layer) for particular applications. Finally, it is noted that the p-sox-p film stack is readily available in any multilayer polysilicon CMOS foundry processes, opening up the possibility of directly integrating MEMS devices and transducers with CMOS.

FIG. 19 shows transducer 1250 including: substrate 1252; anchor points 1254; piezo layer 1256; gold bond pad 1258; and gold bond pad 1260. The anchor points support the piezo layer above the substrate so that portions of the piezo layer, such as bridge portions 1262, are free to vibrate out-of-plane. Because gold bond pads 1258, 1260 are on opposite major surfaces of piezo layer 1256, current path P3 is a cross-plane current path that goes in one major surface and comes out the other. This is true despite the fact that current path P3 has a significant in-plane directional component in its direction. It may not necessarily advantageous to locate electrical contacts so far apart, but transducer 1250 helps show the scope of the concept of a cross-plane current path. Because this embodiment omits the conductive layer, the piezo layer must have sufficient mechanical characteristics to be self-supporting, even in the vicinity of the cantilevered bridge portions 1256.

Figure 27:
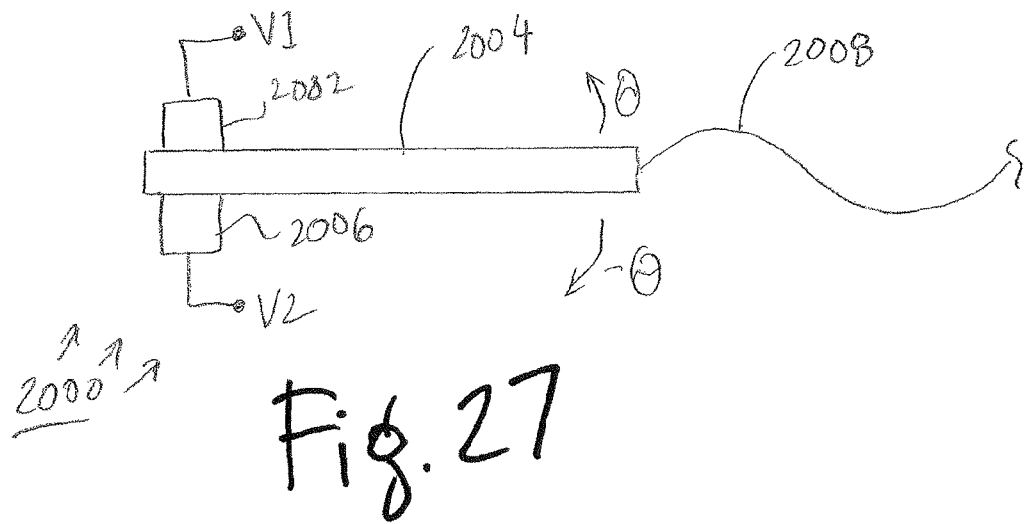
FIG. 27 is a cross-sectional view (cross hatching omitted for clarity) of a twelfth embodiment of a device according to the present invention.

FIG. 27 shows actuator device 2000 including: first contact 2002, piezoelectric layer cantilever structure 2004; second contact 2006 and membrane 2008. Variations in the cross-plane voltage (V1-V2) over time across structure 2004 cause the cantilever structure to rotationally vibrate in the $\theta$ and $-\theta$ angular directions. This vibration actuates membrane 2008 to vibrate. It is noted that the $\theta$ and $-\theta$ angular directions are out-of-plane directions.

Figure 28:
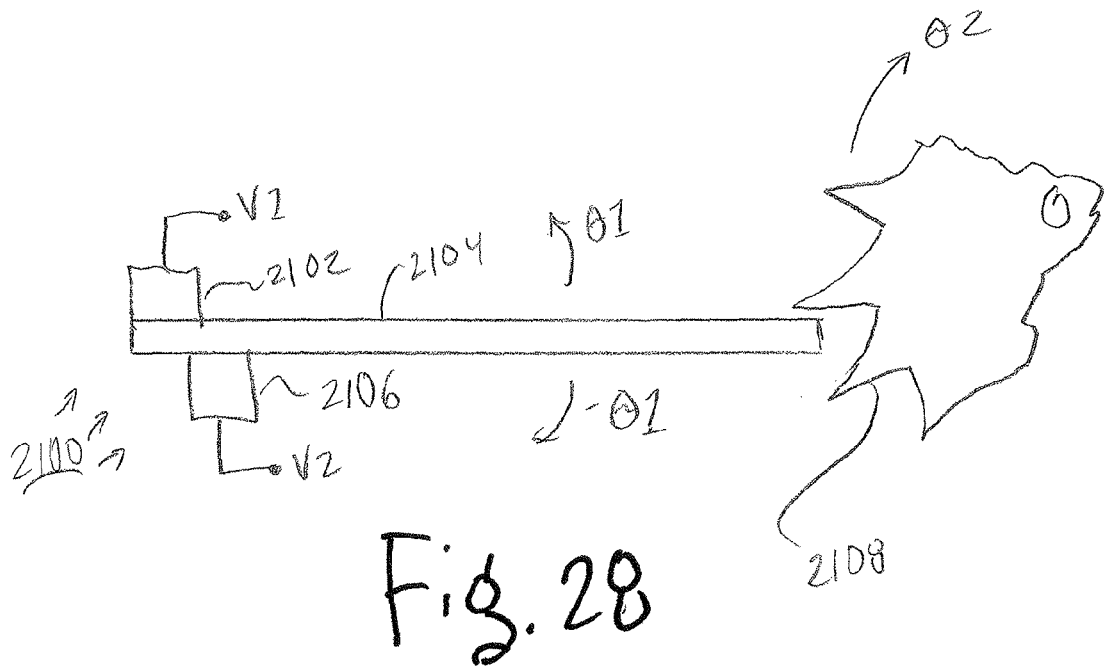
FIG. 28 is a cross-sectional view (cross hatching omitted for clarity) of a thirteenth embodiment of a device according to the present invention.

FIG. 28 shows actuator device 2100 including: first contact 2102, piezoelectric layer cantilever structure 2104; second contact 2106 and micro-scale-gear 2108. Variations in the cross-plane voltage (V1-V2) over time across structure 2104 cause the cantilever structure to rotationally vibrate in the $\theta 1$ and $-\theta 1$ angular directions. This vibration actuates gear 2108 to rotate in the $\theta 2$ direction. It is noted that the $\theta$ and $-\theta$ angular directions are out-of-plane directions.

Figure 29A:
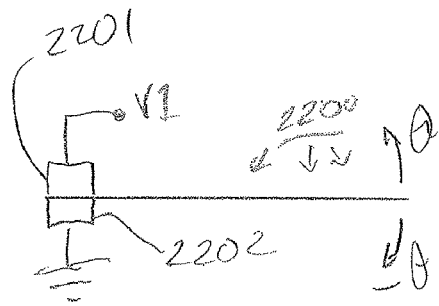
FIGS. 29A and B show orthographic side, and top views of a fourteenth embodiment of a device according to the present invention.
Figure 29B:
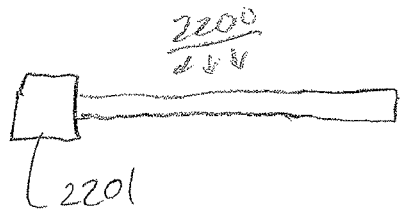

FIGS. 29A and 29B show transducer device 2200 which has out-of-plane motion in the $\theta$ and $-\theta$ directions. More specifically, device 2200 has a single anchor out-of-plane motion pattern, which is often referred to herein as cantilever motion. In device 2200, the electrical contacts 2201, 2202 act as the single anchor point.

Figure 30A:
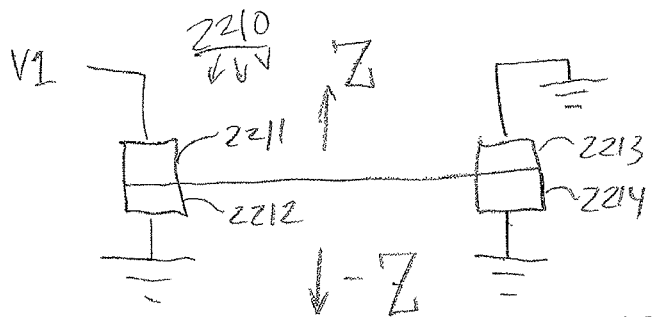
FIGS. 30A and B show orthographic side and top views of a fifteenth embodiment of a device according to the present invention.
Figure 30B:
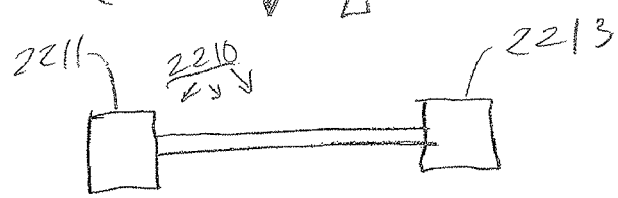

FIGS. 30A and 30B show transducer device 2210 which has out-of-plane motion in the Z and −Z directions. More specifically, device 2210 has a double anchor out-of-plane motion pattern. In device 2210: (i) the electrical contacts 2211, 2212 act as the first anchor point; and (ii) anchor hardware 2213, 2214 act as the second anchor point. In this embodiment, anchor hardware 2213, 2214 does not communicate an electrical signal. Device 2210 shows that anchor points and other anchor structures may or may not be electrical contacts. It is further noted that not all electrical contacts need to serve as anchors, For example, an electrical contact in the form of a thin-stack style electrode layer may communicate electricity to or through a piezo layer while still allowing the piezo layer to move (see FIG. 8 for an example of this).

Figure 31A:
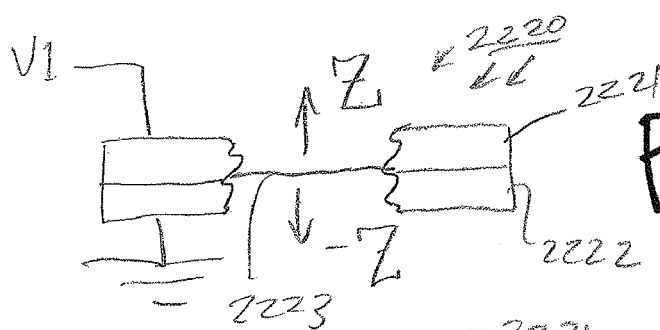
FIGS. 31A and B show orthographic side and top views of a sixteenth embodiment of a device according to the present invention.
Figure 31B:
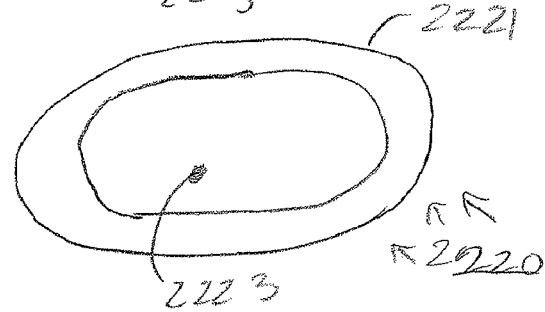

FIGS. 31A and 319B show transducer device 2220 which has out-of-plane motion in the Z and −Z directions. More specifically, device 2220 has electrical contacts 2221 and 2222, which also serve as perimeter style anchor allowing a membrane style out-of-plane motion pattern in piezo layer 2223.

FIGS. 32A and 32B show transducer 2300 including: first electrical contact 2301; first insulated anchor member 2302; second electrical contact 2303; piezoresistive layer 2304; third electrical contact 2310; second insulated anchor member 2311; and fourth electrical contact 2312. Piezoresistive layer 2304 includes curved portion 2305, first fold 2306; and second fold 2307. It is noted that piezoresistive layer 2304 is still considered as a layer, notwithstanding the curve, folds and irregular footprint, because this "layer" has large major surfaces relative to its thickness. It is noted that, in this embodiment, contacts 2301, 2303, 2310, 2312 and anchor members 2302, 2311, all act as anchor points, but they also still allow for out-of-plane (that is, Z-direction) motion in piezoresistive layer 2304. It is noted that, as shown in FIG. 32A, the Z-direction is defined at each local point by the local orientation of piezoresistive layer 2304. The out-of-plane motion of the piezoresistive layer is defined by the local orientation of the major surfaces of the layer at issue. Because the contacts are all at different respective voltages V1, V2, V3, V4, as shown in FIG. 32A, and further because of the irregular shape and layout of transducer 2300, it may be difficult to predict exactly where the current paths will be located within layer 2304. However, because the opposite major surfaces of layer 2304 have generally different voltages, cross-plane current paths are likely to exist.

FIGS. 33 and 34 show a thin-film stack style transducer including first electrode layer 2402; piezoresistive layer 2404; and second electrode layer 2406. Layer 2404 includes insulator portion 2409; first piezo passage 2410; second piezo passage 2412 and third piezo passage 2414. The first piezo passage is generally cylindrical in shape. The second piezo passage has an irregular shape. Third piezo passage 2414 is actually a single atom in size and structure—the first and second piezo passages are larger. The current paths through each of the piezo passages extend between the major surfaces of the piezoresistive layer. Piezoresistive layer 2304 shows that a piezoresistive layer (or, more broadly, any piezo layer) does not necessarily need to be uniformly piezoresistive, or even piezoresistive over a majority of its major surface area. Nevertheless, in order to have a current path that is transverse to the major surfaces of a piezo layer (tat is, extending between the major surfaces) there does need to be a layer structure (such as layer 2404 of FIGS. 33 and 34 or layer 2304 of FIGS. 32A and 32B) defining the major surfaces.

Figure 35:
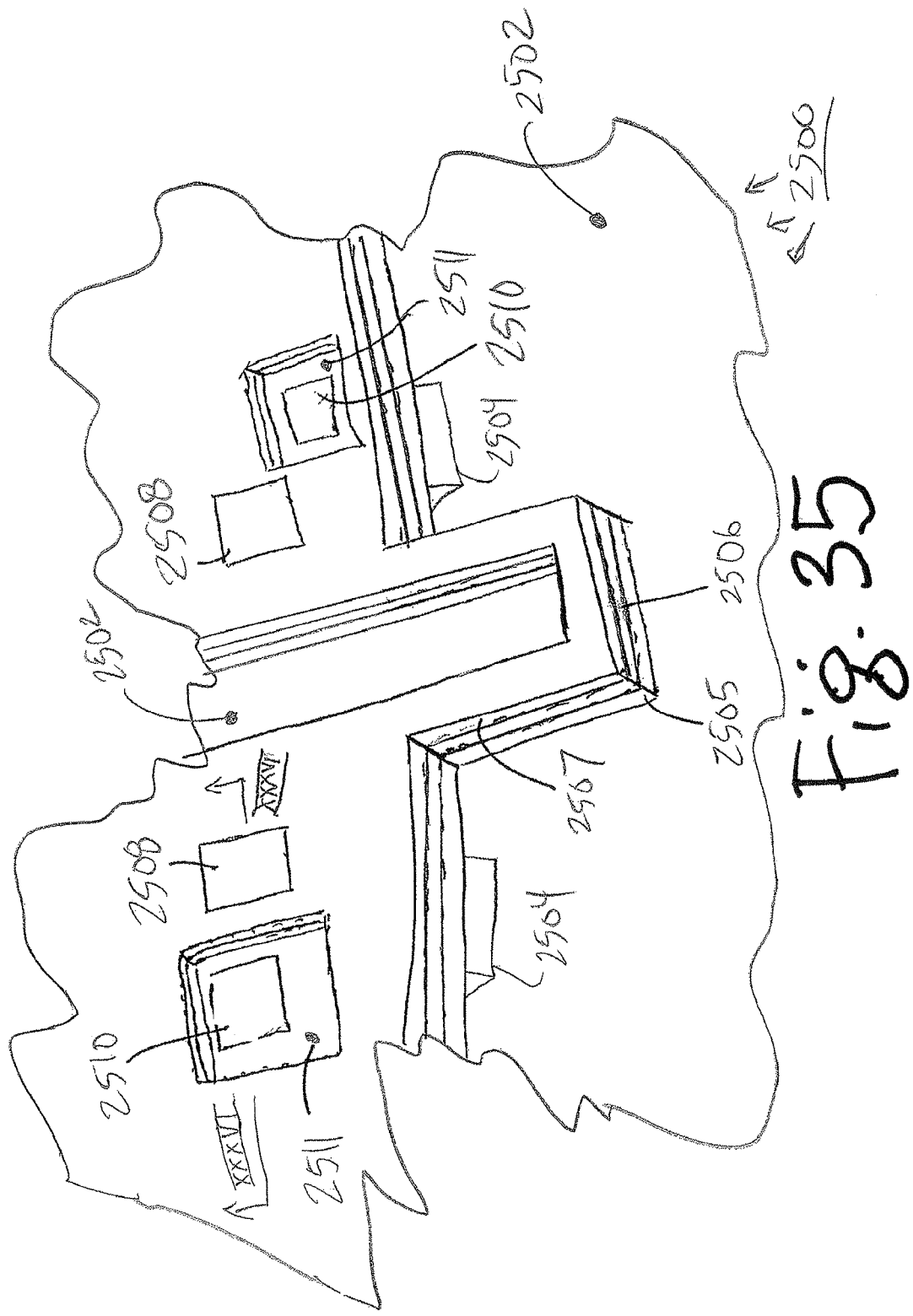
FIG. 35 shows a perspective view of a nineteenth embodiment of a device according to the present invention.
Figure 36:
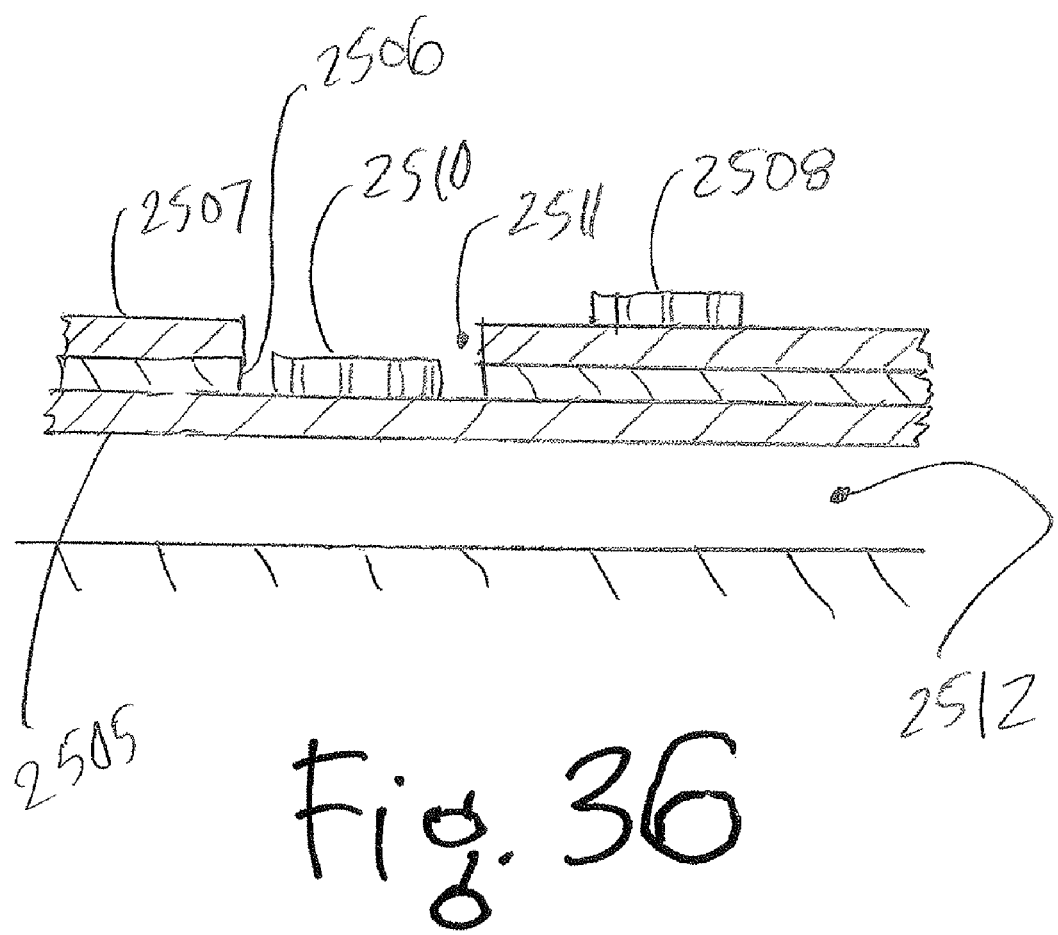
FIG. 36 shows a cross-sectional view of the nineteenth embodiment device.

FIGS. 35 and 36 show transducer 2500 including: substrate 2502; isolation layer 2504; bottom conductive layer 2505; piezoresistive layer 2506; top conductive layer 2507; top-side pads 2508; bottom-side pads 2510; access holes 2511; and freedom-of-motion gap 2512. Current flows from top-side pads 2508 to bottom-side pads through (in order): (i) top-side conductive layer 2507; (ii) piezoresistive layer 2506; and (iii) bottom-side conductive layer 2505. This flow will include a cross-plane conductive paths through piezoresistive layer 2506 because current will come into its top major surface and out of its bottom major surface. This current can be used to drive and/or detect out-of-plane motion, or vibration, in thin-film stack 2505, 2506, 2507.

DEFINITIONS

The following definitions of terms used herein are provided for concise claim interpretation:

Present invention/the invention: means at least some embodiments of the present invention; references to various feature(s) of the "present invention" throughout this document do not mean that all claimed embodiments or methods include the referenced feature(s).

Embodiments: the word "embodiments" may be used herein to describe methods, as well as machines and/or manufactures.

Transducer type devices: include, but are not necessarily limited to resonators, oscillators, reference oscillators for timing applications, sensors, filters, switches, and/or actuators.

Piezo properties/piezo characteristics: a material where at least one electrical characteristic or property varies with variations in mechanical stress or strain, and/or variations in mechanical stress and/or strain cause variation in at least one electrical characteristic or property; materials with piezo properties include, but are not necessarily limited to, piezoelectric materials, reverse piezo electric materials, piezoresistive materials, reverse piezoresistive materials, piezoconductive materials and reverse piezoconductive materials.

Piezo layer: any layer having piezo properties over at least a portion of the layer (see DEFINITIONS section); some piezo layers have substantially uniform piezo properties over and through the entire layer.

Stress dependent/stress dependent layer: material with piezoresistive properties and/or piezoconductive properties over at least a portion of the layer; some piezo layers have substantially uniform stress dependence over and through the entire layer.

Small scale: micro-scale and/or nano-scale.

Cross-plane/cross-plane direction: any electrical path through a layer (see DEFINITIONS section) or stack of layers that travels from one major surface of the layer (see DEFINITIONS section) to the opposite surface of the layer.

Layer: does not necessarily imply that the layer must be flat or planar or continuous; irregular, bent and/or curved layers are still considered as layers.

Between/in a stack: when layers are described as being "in a stack" (for example, in a thin-film stack) or are described as being "between," this does not necessarily imply that the layers are directly adjacent and/or in direct contact; for example, if a third layer is described as being between a first and second layer, then there may (or may not) be a fourth layer between the first and third layer and there may (or may not) be a fifth layer between the second and third layer.

Subsequent: when used in a method claim, "subsequent" does not necessarily mean directly subsequent—in other words, "subsequent" does not rule out the possibility of intervening or overlapping in time steps, whether recited or unrecited in the claim.

In-plane: any electrical path through a layer or series of layers with a substantial directional component parallel to the major surfaces of the layer(s) through which the path travels.

Contact member: may be constituted by or include various types of electrically conductive structures, such as electrode layers, piezo layers, bond pads, wires, via, etc.; for example, if an intermediate layer is sandwiched between two other piezoresistive layers, then the piezoresistive layers can be considered as electrical contacts relative to the intermediate layers; as a further example, if a stack of piezoresistive layers is sandwiched between two conductive layers, then the conductive layers can be considered as contacts with respect to the stack of piezoresistive layers.

Mechanically connected: Includes both direct mechanical connections, and indirect mechanical connections made through intermediate components; includes rigid mechanical connections as well as mechanical connection that allows for relative motion between the mechanically connected components.

Cantilever: includes, but is not limited, to a cantilever having something attached to and/or some degree of constraint at its free ends, so long as cantilevered motion can still occur; foe example, a "cantilever" may be connected to a ether at its free end, or may be attached to a membrane at it free end.

Out-of-plane motion: motion in at least a portion of a layer that includes a substantial directional component perpendicular to the local portion of the portion(s) of the major surface that is moving; out-of-plane motion includes, but is not necessarily limited to: displacement of an entire layer (so long as the displacement has a directional component in the out-of-plane direction); single anchor out-of-plane motion; double anchor out-of-plane motion; and membrane style out-of-plane motion.

Anchored out-of-pane motion: includes, but is not necessarily limited to: single anchor out-of-plane motion; double anchor out-of-plane motion; and membrane style out-of-plane motion.

Piezoresistive: having electrical properties (such as resistivity) so that changes in resistivity with stress or stress can be detected.

Strongly piezoresistive: piezoresistive and having a gauge factor greater than 0.1.

What is claimed is:

1. A transducer, comprising:
a substrate;
a transducer assembly including a first contact member, a second contact member, and a moveable piezo layer, with the transducer assembly being mechanically connected to the substrate;
wherein:
the first electrical contact member includes a first major surface;
the first electrical contact is electrically connected to a first major surface of the piezo layer over at least a contacting portion of the first major surface of the first electrical contact member;
the second electrical contact is electrically connected to a second major surface of the piezo layer, with the second major surface being opposite the first major surface; and
the contacting portion is roughened so as to promote electrical breakdown of the piezoresistive layer.

2. The transducer of claim 1, wherein the piezo layer is in the form of a thin-film; the first contact member comprises a first electrically conductive layer in the form of a thin film; the second contact member comprises an electrically conductive layer in the form of a thin-film; and the transducer assembly is in the form of a thin-film stack with the piezo layer disposed at least partially between the first electrically conductive layer and the second electrically conductive layer.

3. The transducer of claim 2, wherein the thin-film stack is generally planar in shape; the thin-film stack has first and second major surfaces; and the thin-film stack is free to move in an out-of-plane motion pattern.

4. The transducer of claim 3, wherein the thin-film stack is free to move in an anchored out-of-plane motion pattern.

5. The transducer of claim 4, wherein the thin-film stack is free to move in a double anchor out-of-plane motion pattern.

6. The transducer of claim 4, wherein the thin-film stack is free to move in a double anchor out-of-plane motion pattern.

7. A transducer, comprising:
a substrate;
an isolation layer; and
a transducer assembly in the form of a thin-film stack including a first electrically conductive layer, a stress dependent layer, and a second electrically conductive layer, with the isolation layer mechanically connecting the thin film stack to the substrate so that at least a portion of the thin-film stack is free to move out-of plane;
wherein the stress dependent layer is disposed at least partially between the first electrically conductive layer and the second electrically conductive layer;
further wherein the transducer assembly has at least one electrical conduction path from the first electrically conductive layer to the second electrically conductive layer extending through the stress dependent layer.

8. The transducer of claim 7, wherein the stress dependent layer has a piezoresistive property; and the electrical conduction path has a variable electrical resistance in the stress dependent layer that varies in value as a function of the out-of-plane motion of the stress dependent layer.

9. The transducer of claim 7, further comprising a first bond pad and a second bond pad, wherein the first bond pad is in electrically conductive contact with the first electrically conductive layer and the second bond pad is in electrically conductive contact with the second electrically conductive layer.

10. The transducer of claim 7, wherein the first electrically conductive layer comprises polysilicon and the second electrically conductive layer comprises polysilicon.

11. The transducer of claim 7, wherein the first electrically conductive layer comprises highly doped polysilicon and the second electrically conductive layer comprises highly doped polysilicon.

12. The transducer of claim 7, wherein the stress dependent layer comprises silicon dioxide.

13. The transducer of claim 7, wherein the stress dependent layer comprises silicon nitride.

14. The transducer of claim 7, wherein the transducer is at least one of a resonator, an oscillator, a sensor, a filter, and a switch.

15. The transducer of claim 7, having a range of out-of-plane motion of less than 1000 microns.

16. The transducer of claim 15, having a range of out-of-plane motion of less than 1000 nanometers.

17. The transducer of claim 7, wherein a gauge factor of the stress dependent layer is greater than 0.1.

18. The transducer of claim 17, wherein at least the stress dependent layer is free to move in an anchored out-of-plane motion pattern.

19. The transducer of claim 17, wherein at least the stress dependent layer is free to move in a single anchor out-of-plane motion pattern.

20. The transducer of claim 17, wherein at least the stress dependent layer is free to move in a double anchor out-of-plane motion pattern.

21. A method of making a transducer comprising the following steps:
(a) providing a substrate;
(b) providing at least a portion of an isolation layer over at least a portion of the substrate;
(c) providing at least a portion of a first electrically conductive layer over at least a portion of the isolation layer;
(d) providing at least a portion of a piezoresistive layer over at least a portion of the first electrically conductive layer;
(e) providing at least a portion of a second electrically conductive layer over at least a portion of the piezoresistive layer; and
(f) performing an action to do at least one of the following:
(i) reduce the resistance of the piezoresistive layer, and
(ii) increase a piezoresistive response of the piezoresistive layer.

22. The method of claim 21, wherein the step (f) includes at least incorporating charge from at least one of the first or second electrically conductive layers.

23. The method of claim 21, wherein the step (f) includes at least incorporating dopants from at least one of the first or second electrically conductive layers.

24. The method of claim 21, wherein the step (f) includes at least roughening at least one of the first or second electrically conductive layers in such a way as to promote electrical breakdown of the piezoresistive layer.

25. The method of claim 21, wherein the step (f) includes at least releasing using a release agent.

26. The method of claim 21, wherein the step (f) includes at least applying a breakdown voltage across the piezoresistive layer.

27. The method of claim 21, wherein the step (f) includes at least incorporating agents into at least one of the first and second electrically conductive layers such that in response to an external trigger, the agents migrate into the piezoresistive layer.

28. The method of claim 21, wherein the step (f) includes at least stressing the piezoresistive layer such that electrically breakdown occurs in the piezoresistive layer.

29. The method of claim 21, wherein step (e) is performed by growing a layer of highly doped polysilicon over at least a portion of the isolation layer.

30. The method of claim 21, wherein step (e) is performed by growing a layer of highly doped polysilicon over at least a portion of the piezoresistive layer.

31. The method of claim 21, wherein step (d) is performed by growing a layer of silicon dioxide over at least a portion of the first electrically conductive layer.

32. The method of claim 31, wherein step (d) is performed by thermally growing a layer of silicon dioxide over at least a portion of the first electrically conductive layer.

33. The method of claim 21, wherein step (d) is performed by depositing a layer of silicon dioxide over at least a portion of the first electrically, conductive layer.

34. The method of claim 21, further comprising the step of:
(g) assembling the transducer assembly with additional hardware where the additional hardware allows the transducer to act as at least one of the following device types: a resonator, an oscillator, a sensor, a filter, and a switch.

35. A method of making a transducer comprising the following steps:
(a) providing a substrate;
(b) providing at least a portion of an isolation layer over at least a portion of the substrate;
(c) providing at least a portion of a first electrically conductive layer over at least a portion of the isolation layer;
(d) providing at least a portion of a piezoresistive layer over at least a portion of the first electrically conductive layer, with the piezoresistive layer having a gauge factor of less than 0.1;
(e) providing at least a portion of a second electrically conductive layer over at least a portion of the piezoresistive layer; and
(f) increasing the gauge factor of the piezoresistive layer to a value greater than 0.1.

36. The method of claim 35, wherein the piezoresistive layer comprises silicon dioxide.

37. The method of claim 35, wherein the piezoresistive layer comprises silicon nitride.

* * * * *